(12) United States Patent
Fujikane et al.

(10) Patent No.: US 8,455,905 B2
(45) Date of Patent: Jun. 4, 2013

(54) SEMICONDUCTOR LIGHT-EMITTING DEVICE

(75) Inventors: Masaki Fujikane, Osaka (JP); Akira Inoue, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/274,759

(22) Filed: Oct. 17, 2011

(65) Prior Publication Data

US 2012/0091490 A1 Apr. 19, 2012

(30) Foreign Application Priority Data

Oct. 19, 2010 (JP) ................... 2010-234544

(51) Int. Cl.
*H01L 33/00* (2010.01)
(52) U.S. Cl.
USPC .............. 257/98; 257/E33.025; 257/E33.073
(58) Field of Classification Search
CPC .................................. H01L 33/60; H01L 33/62
USPC .............. 257/98, E33.025, E33.073; 438/22, 438/29, 46
See application file for complete search history.

(56) References Cited

U.S. PATENT DOCUMENTS

| 2001/0000622 | A1 | 5/2001 | Reeh et al. |
| 2003/0227249 | A1* | 12/2003 | Mueller et al. ................. 313/491 |
| 2005/0224826 | A1 | 10/2005 | Keuper et al. |
| 2008/0128729 | A1* | 6/2008 | Okamoto ........................ 257/98 |
| 2008/0308825 | A1* | 12/2008 | Chakraborty et al. .......... 257/98 |
| 2009/0279278 | A1 | 11/2009 | Tsujimura et al. |

FOREIGN PATENT DOCUMENTS

| JP | 11-500584 A | 1/1999 |
| JP | 2005-197317 A | 7/2005 |
| JP | 2009-038292 A | 2/2009 |
| JP | 2009-111100 A | 5/2009 |
| JP | 2010-165996 A | 7/2010 |

* cited by examiner

*Primary Examiner* — Nikolay Yushin
(74) *Attorney, Agent, or Firm* — Renner, Otto, Boisselle & Sklar, LLP

(57) ABSTRACT

Provided is a light-emitting device including: a nitride semiconductor light-emitting element (402) which radiates optically polarized light; and a light emission control layer (404) which covers the light emission surface of the nitride semiconductor light-emitting element (402) and which contains a resin and non-fluorescent particles dispersed in the resin, in which the light emission control layer (404) contains the non-fluorescent particles at a proportion of 0.01 vol % or more and 10 vol % or less, and the non-fluorescent particles have a diameter of 30 nm or more and 150 nm or less.

25 Claims, 10 Drawing Sheets

SEMICONDUCTOR LIGHT-EMITTING DEVICE

BACKGROUND OF THE INVENTION

1. Field of the Invention

The present invention relates to a GaN-based semiconductor light-emitting element such as a light-emitting diode or a laser diode that operates at wavelengths over the ultraviolet range and the entire visible radiation range, which covers blue, green, orange, and white parts of the spectrum. Such a light-emitting element is expected to be applied to various fields of technologies including display, illumination, and optical information processing.

2. Description of the Related Art

A nitride semiconductor including nitrogen (N) as a Group V element is a prime candidate for a material to make a short-wave light-emitting element because its bandgap is sufficiently wide. Among others, gallium nitride-based compound semiconductors including Ga as a Group III element (which are hereinafter referred to as "GaN-based semiconductors" and are represented by the formula $Al_xGa_yIn_zN$ (where $0 \leq x, y, z \leq 1$ and $x+y+z=1$)) have been researched extensively. As a result, blue light-emitting diodes (LEDs), green LEDs, and semiconductor laser diodes made of GaN-based semiconductors have already been used in actual products.

A GaN-based semiconductor has a wurtzite crystal structure. FIG. 1 schematically illustrates a unit cell of GaN. In an $Al_xGa_yIn_zN$ (where $0 \leq x, y, z \leq 1$ and $x+y+z=1$) semiconductor crystal, some of the Ga atoms shown in FIG. 1 may be replaced with Al and/or In atoms.

FIG. 2 shows four fundamental vectors $a_1$, $a_2$, $a_3$, and c of a wurtzite crystal structure. The fundamental vector c runs in the [0001] direction, which is called a "c-axis". A plane that intersects with the c-axis at right angles is called either a "c-plane" or a "(0001) plane". A plane terminated by a Group III element such as Ga is called "+c-plane" or "(0001) plane" whereas a plane terminated by a Group V element such as nitrogen is called "−c-plane" or "(000-1) plane", and the two are discriminated from each other. It should be noted that the "c-axis" and the "c-plane" are sometimes referred to as "C-axis" and "C-plane".

In fabricating a semiconductor element using GaN-based semiconductors, a c-plane substrate, i.e., a substrate of which the principal surface is a (0001) plane, is used as a substrate on which GaN-based semiconductor crystals will be grown. In a c-plane, however, Ga atoms and nitrogen atoms are not on the same atomic plane, thus producing electrical polarization. That is why the "c-plane" is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer. Consequently, due to the quantum confinement Stark effect of carriers, the internal quantum yield decreases, thus increasing the threshold current in a semiconductor laser diode and increasing the power dissipation and decreasing the luminous efficacy in an LED. Meanwhile, as the density of injected carriers increases, the piezoelectric field is screened and also the emission wavelength is varied.

Thus, to overcome these problems, it has been proposed that a substrate of which the principal surface is a non-polar plane such as a (10-10) plane that is perpendicular to the [10-10] direction and that is called an "m-plane" (m-plane GaN-based substrate) be used. As used herein, "-" attached on the left-hand side of a Miller index in the parentheses means a "bar". As shown in FIG. 2, the m-plane is parallel to the c-axis (i.e., the fundamental vector c) and intersects with the c-plane at right angles. On the m-plane, Ga atoms and nitrogen atoms are on the same atomic-plane. For that reason, no electrical polarization is produced perpendicularly to the m-plane. That is why if a semiconductor multilayer structure is formed perpendicularly to the m-plane, no piezoelectric field is generated in the active layer, thus overcoming the problems described above. The "m-plane" is a generic term that collectively refers to a family of planes including (10-10), (−1010), (1-100), (−1100), (01-10) and (0-110) planes.

Nitride semiconductor light-emitting elements that have a non-polar plane such as an m-plane or a semi-polar plane as the principal surface are known to emit polarized light. For instance, Japanese Laid-Open Patent Publication No. 2009-38292 proposes a structure that maintains the optical polarization characteristics of light emitted from a nitride semiconductor light-emitting element that has a non-polar plane or a semi-polar plane as the principal surface through the random placement of resin molecules. FIG. 3A is a sectional view illustrating the structure that is disclosed in Japanese Laid-Open Patent Publication No. 2009-38292. In FIG. 3A, a light-emitting element 302 which emits optically polarized light is put on a package base 301 and a light-transmissive resin portion 303 is disposed so as to surround the light-emitting element 302. The light-transmissive resin portion 303 which has a disordered structure does not exhibit birefringence.

An example of a mode of a resin sealing portion for a nitride semiconductor light-emitting element can be found in Japanese Patent Translation Publication No. Hei 11-500584, which proposes a semiconductor light-emitting element structure that uses a luminous substance pigment to emit white light. FIG. 3B is a sectional view illustrating the structure that is disclosed in Japanese Patent Translation Publication No. Hei 11-500584. In the semiconductor light-emitting element illustrated in FIG. 3B, a semiconductor base 305 is put in a container 304 and a casting material 306 is disposed so as to surround the semiconductor base 305. The casting material 306 contains luminous substance pigments 307 which convert light emitted from the semiconductor base 305 into long-wave light.

Another example of a mode of a resin sealing portion for a nitride semiconductor light-emitting element can be found in Japanese Laid-Open Patent Publication No. 2005-197317, which discloses a structure that raises the light emission efficiency by enhancing the refractive index of a medium. FIG. 3C is a sectional view illustrating the structure that is disclosed in Japanese Laid-Open Patent Publication No. 2005-197317. In FIG. 3C, an optical semiconductor element 309 is put in a package 308 and a medium 310 is disposed so as to surround the optical semiconductor element 309. The medium 310 contains nanoparticles 312 made from a material that has, when in a bulk state, a refractive index higher than that on an exit surface of the optical semiconductor element 309 within the wavelength range of emitted light. The medium 310 also contains fluorescent particles 311 which convert emitted light of the optical semiconductor element 309 into long-wave light.

However, when a light-emitting element that has optical polarization characteristics is a light source, the amount of reflection at a surface of an object varies and how the object looks accordingly varies, depending on the direction of optical polarization, namely, the direction in which the light-emitting element is set up. This problem is caused by a difference in reflectance between P polarization and S polarization (the reflectance of P polarization is higher than that of S polarization). While improving the optical polarization degree is important in applications where optical polarization characteristics are utilized without modification, having optical polarization characteristics thus impairs the performance of a light-emitting element in general illumination uses.

Another problem is that, because it is the nature of light to travel in a direction perpendicular to the optical polarization direction, optically polarized light that is generated by a nitride semiconductor light-emitting element deviates from radiant intensity distribution characteristics having the pattern of Lambert's cosine law (Lambertian/Lambert distribution).

These problems are particularly noticeable in gallium nitride-based light-emitting elements that have a non-polar plane or a semi-polar plane as the principal surface, and pose a major obstacle to putting light-emitting elements that have a non-polar plane or a semi-polar plane as the principal surface into practice.

Japanese Laid-Open Patent Publication No. 2009-38292, where the objective is to maintain the optical polarization characteristics of a nitride semiconductor light-emitting element that has an m-plane as the principal surface, is not a solution to the above-mentioned problems. Japanese Patent Translation Publication No. Hei 11-500584 and Japanese Laid-Open Patent Publication No. 2005-197317, too, do not provide a solution to the above-mentioned problems because these publications are not about nitride semiconductor light-emitting elements having optical polarization characteristics in the first place.

SUMMARY OF THE INVENTION

The present invention has been made to solve the problems described above, and a main object of the present invention is to reduce the optical polarization characteristics of a light-emitting element that has a non-polar plane or a semi-polar plane as the principal surface, and to provide a mode of a resin sealing portion that is improved in radiant intensity distribution characteristics.

According to the present invention, there is provided a light-emitting device, including: a nitride semiconductor light-emitting element which includes a light emission surface and which radiates optically polarized light from the light emission surface; and a light emission control layer which covers the light emission surface of the nitride semiconductor light-emitting element and which contains a resin and non-fluorescent particles dispersed in the resin, in which the light emission control layer contains the non-fluorescent particles at a proportion of 0.01 vol % or more and 10 vol % or less, the non-fluorescent particles have a diameter of 30 nm or more and 150 nm or less, and, if a radiant intensity in an m-axis direction is set as 100% and an angle in the m-axis direction is set as 0°, a difference in radiant intensity between radiant intensity distribution characteristics observed when an a-axis is a rotation axis and an angle range is from −90° to 90° and radiant intensity distribution characteristics observed when a c-axis is the rotation axis and the angle range is from −90° to 90° is 26% points or less at the same angle.

In an embodiment mode, when the radiant intensity in the m-axis direction is set as 100% and the angle in the m-axis direction is set as 0°, a difference in radiant intensity between radiant intensity distribution characteristics observed when the a-axis is the rotation axis and the angle range is from −90° to 90° and radiant intensity distribution characteristics observed when the c-axis is the rotation axis and the angle range is from −90° to 90° is 25% points or less at the same angle.

In another embodiment mode, when the radiant intensity in the m-axis direction is set as 100% and the angle in the m-axis direction is set as 0°, a difference in radiant intensity between radiant intensity distribution characteristics observed when the a-axis is the rotation axis and the angle range is from −90° to 90° and radiant intensity distribution characteristics observed when the c-axis is the rotation axis and the angle range is from −90° to 90° is 14% points or less at the same angle.

In still another embodiment mode, the non-fluorescent particles have a refractive index of 1.4 or more and 2.9 or less.

In yet another embodiment mode, the non-fluorescent particles have a bandgap of 3.0 eV or more and 6.3 eV or less.

In yet another embodiment mode, the light-emitting device further includes a package substrate which supports the nitride semiconductor light-emitting element on a principal surface, a distance from a surface of the light emission control layer to an intersection point between diagonal lines of a graphic form which is an orthogonal projection image of the nitride semiconductor light-emitting element projected onto the principal surface of the package substrate is referred to as intra-layer distance, a length of a line segment that connects two points along sides of the graphic form is referred to as intra-element distance, and a maximum value of the intra-layer distance is 1.5 times a maximum value of the intra-element distance or more.

In yet another embodiment mode, a ratio of the maximum value of the intra-layer distance of the light emission control layer to the maximum value of the intra-element distance is larger than a refractive index of the light emission control layer.

In yet another embodiment mode, the light emission control layer contains a fluorescent substance.

In yet another embodiment mode, the light-emitting device further includes a second sealing portion which covers a surface of the light emission control layer.

In yet another embodiment mode, the light-emitting device further includes a package substrate which supports the nitride semiconductor light-emitting element on a principal surface, a distance from a surface of the second sealing portion to an intersection point between diagonal lines of a graphic form which is an orthogonal projection image of the nitride semiconductor light-emitting element projected onto the principal surface of the package substrate is referred to as intra-layer distance of the second sealing portion, a distance from a surface of the light emission control layer to the intersection point between the diagonal lines of the graphic form is referred to as intra-layer distance of the light emission control layer, and a maximum value of the intra-layer distance of the second sealing portion is 1.5 times a maximum value of the intra-layer distance of the light emission control layer or more.

In yet another embodiment mode, a ratio of the maximum value of the intra-layer distance of the second sealing portion to the maximum value of the intra-layer distance of the light emission control layer is larger than a refractive index of the light emission control layer.

In yet another embodiment mode, the second sealing portion is made from an inorganic material.

In yet another embodiment mode, the light-emitting device further includes a first sealing portion which covers the light emission surface of the nitride semiconductor light-emitting element, and the light emission control layer covers the light emission surface of the nitride semiconductor light-emitting element from above the first sealing portion.

In yet another embodiment mode, the first sealing portion contains a fluorescent substance.

In yet another embodiment mode, the first sealing portion has a hardness lower than a hardness of the light emission control layer.

In yet another embodiment mode, the first sealing portion has a refractive index larger than a refractive index of the light emission control layer.

According to the present invention, there is provided another light-emitting device, including: a nitride semiconductor light-emitting element which includes a light emission surface and which radiates optically polarized light from the light emission surface; and a light emission control layer which covers the light emission surface of the nitride semiconductor light-emitting element and which contains a resin and non-fluorescent particles dispersed in the resin, in which the light emission control layer contains the non-fluorescent particles at a proportion of 0.01 vol % or more and 10 vol % or less, and the light-emitting device has a narrower radiation angle in an a-axis direction and a wider radiation angle in a c-axis direction than when the light emission control layer does not contain the non-fluorescent particles.

In an embodiment mode, when the radiant intensity in the m-axis direction is set as 100% and the angle in an m-axis direction is set as 0°, a difference in radiant intensity between radiant intensity distribution characteristics observed when the a-axis is a rotation axis and an angle range is from −90° to 90° and radiant intensity distribution characteristics observed when the c-axis is the rotation axis and the angle range is from −90° to 90° is 25% points or less at the same angle.

In another embodiment mode, when the radiant intensity in an m-axis direction is set as 100% and the angle in the m-axis direction is set as 0°, a difference in radiant intensity between radiant intensity distribution characteristics observed when the a-axis is a rotation axis and an angle range is from −90° to 90° and radiant intensity distribution characteristics observed when the c-axis is the rotation axis and the angle range is from −90° to 90° is 14% points or less at the same angle.

In still another embodiment mode, the non-fluorescent particles have a refractive index of 1.4 or more and 2.9 or less.

In yet another embodiment mode, the non-fluorescent particles have a bandgap of 3.0 eV or more and 6.3 eV or less.

In yet another embodiment mode, the light-emitting device further includes a package substrate which supports the nitride semiconductor light-emitting element on a principal surface, a distance from a surface of the light emission control layer to an intersection point between diagonal lines of a graphic form which is an orthogonal projection image of the nitride semiconductor light-emitting element projected onto the principal surface of the package substrate is referred to as intra-layer distance, a length of a line segment that connects two points along sides of the graphic form is referred to as intra-element distance, and a maximum value of the intra-layer distance is 1.5 times a maximum value of the intra-element distance or more.

In yet another embodiment mode, a ratio of the maximum value of the intra-layer distance to the maximum value of the intra-element distance is larger than a refractive index of the light emission control layer.

In yet another embodiment mode, the light emission control layer contains a fluorescent substance.

In yet another embodiment mode, the light-emitting device further includes a second sealing portion which covers a surface of the light emission control layer.

In yet another embodiment mode, the light-emitting device further includes a package substrate which supports the nitride semiconductor light-emitting element on a principal surface, a distance from a surface of the second sealing portion to an intersection point between diagonal lines of a graphic form which is an orthogonal projection image of the nitride semiconductor light-emitting element projected onto the principal surface of the package substrate to a surface of the light emission control layer is referred to as intra-layer distance of the second sealing portion, a distance from a surface of the light emission control layer to the intersection point between the diagonal lines of the graphic form is referred to as intra-layer distance of the light emission control layer, and a maximum value of the intra-layer distance of the second sealing portion is 1.5 times a maximum value of the intra-layer distance of the light emission control layer or more.

In yet another embodiment mode, a ratio of the maximum value of the intra-layer distance of the second sealing portion to the maximum value of the intra-layer distance of the light emission control layer is larger than a refractive index of the light emission control layer.

In yet another embodiment mode, the second sealing portion is made from an inorganic material.

In yet another embodiment mode, the light-emitting device further includes a first sealing portion which covers the light emission surface of the nitride semiconductor light-emitting element, and the light emission control layer covers the light emission surface of the nitride semiconductor light-emitting element from above the first sealing portion.

In yet another embodiment mode, the first sealing portion contains a fluorescent substance.

In yet another embodiment mode, the first sealing portion has a hardness lower than a hardness of the light emission control layer.

In yet another embodiment mode, the first sealing portion has a refractive index larger than a refractive index of the light emission control layer.

According to the present invention, there is provided still another light-emitting device, including: a nitride semiconductor light-emitting element which includes a light emission surface and which radiates optically polarized light from the light emission surface; and a light emission control layer which covers the light emission surface of the nitride semiconductor light-emitting element and which contains a resin and non-fluorescent particles dispersed in the resin, in which the light emission control layer contains the non-fluorescent particles at a proportion of 0.01 vol % or more and 10 vol % or less, and the non-fluorescent particles have a diameter of 30 nm or more and 150 nm or less.

According to the present invention, there is provided a method of manufacturing a light-emitting device, including: a first step of preparing a nitride semiconductor light-emitting element which has a light emission surface and which radiates optically polarized light from the light emission surface; and a second step of generating a light emission control layer which covers the light emission surface of the nitride semiconductor light-emitting element and which contains a resin and non-fluorescent particles dispersed in the resin, in which, in the second step, the light emission control layer contains the non-fluorescent particles at a proportion of 0.01 vol % or more and 10 vol % or less, the light-emitting device has a narrower radiation angle in an a-axis direction and a wider radiation angle in a c-axis direction than when the light emission control layer does not contain the non-fluorescent particles, and, when a radiant intensity in an m-axis direction is set as 100% and an angle in the m-axis direction is set as 0°, the fluorescent particles are dispersed in the resin in a manner that makes a radiant intensity difference at the same angle 25% points or less between radiant intensity distribution characteristics observed when an a-axis is a rotation axis and an angle range is from −90° to 90° and radiant intensity distribution characteristics observed when a c-axis is the rotation axis and the angle range is from −90° to 90°.

According to the present invention, with the light emission control layer containing non-fluorescent particles, the optical polarization degree of optically polarized light that is emitted from the nitride semiconductor light-emitting element is reduced and radiant intensity distribution characteristics are improved as well.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Nitride semiconductor light-emitting elements according to embodiments of the present invention are described below with reference to the drawings.

(First Embodiment)

Figure 1:
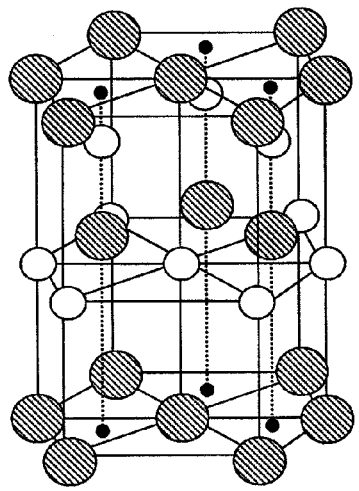
FIG. 1 is a perspective view schematically illustrating a unit cell of GaN.
Figure 1:
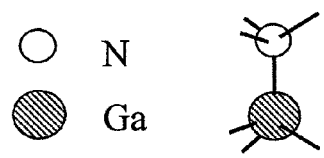
Figure 2:
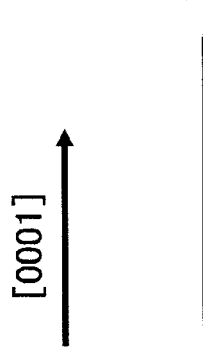
FIG. 2 is a perspective view illustrating fundamental vectors $a_1$, $a_2$, $a_3$, and c of a wurtzite crystal structure.
Figure 2:
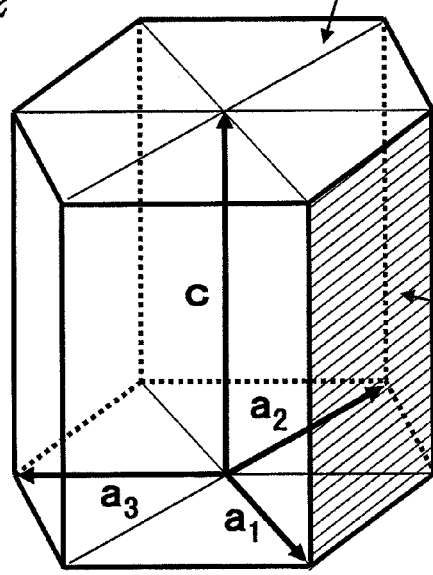
Figure 3A:
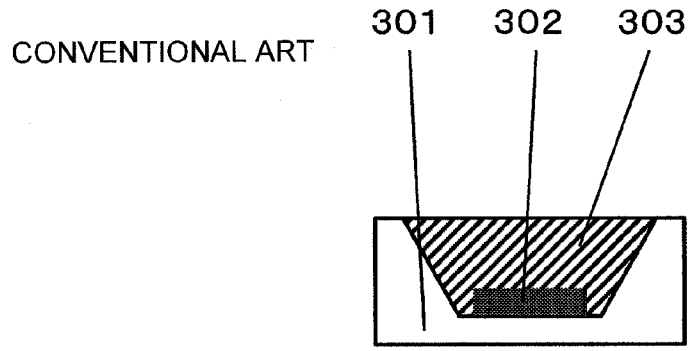
FIGS. 3A to 3C are diagrams schematically illustrating conventional modes of sealing a light-emitting element.
Figure 3B:
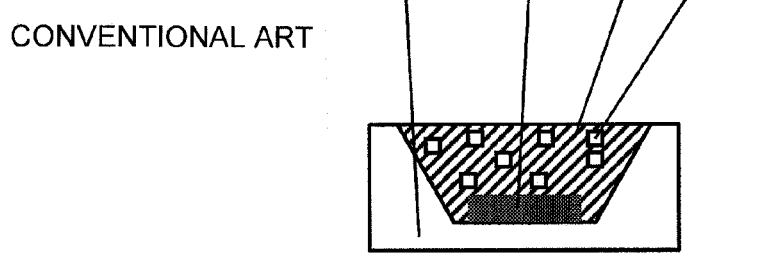
Figure 3C:
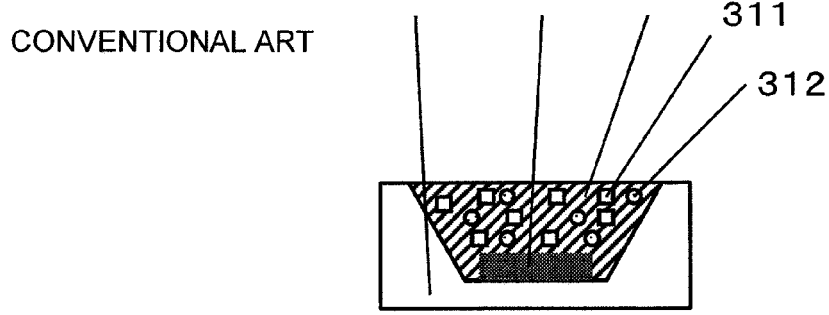
Figure 4A:
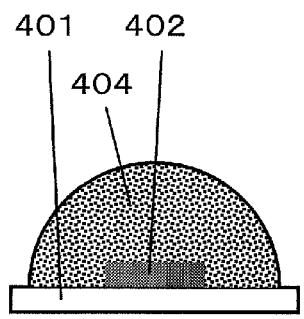
FIGS. 4A to 4I are diagrams schematically illustrating modes of sealing a light-emitting element according to the present invention.

FIG. 4A is a diagram illustrating a mode of sealing a nitride semiconductor light-emitting device according to a first embodiment of the present invention.

As illustrated in FIG. 4A, the light-emitting device of this embodiment includes a package substrate 401, a nitride semiconductor light-emitting element 402, which is put on the package substrate 401, and a light emission control layer 404, which covers a light emission surface of the nitride semiconductor light-emitting element 402. An electrode of the nitride semiconductor light-emitting element 402 is connected to the package substrate 401 by wiring.

The nitride semiconductor light-emitting element 402 has an active layer formed on a non-polar plane or a semi-polar plane, and consequently radiates optically polarized light. However, an off-cut plane of a c-plane, namely, a polar plane, that is at an angle of several degrees (within 5 degrees, for example) to the c-plane is not counted as a "surface that radiates optically polarized light."

The light emission control layer 404 is disposed on the package substrate 401 so as to cover the nitride semiconductor light-emitting element 402, which has optical polarization characteristics. The light emission control layer 404 contains a resin, which constitutes the base material, and non-fluorescent particles, which are dispersed in the resin. The non-fluorescent particles are dispersed at a volume concentration of 0.01 vol % or more and 10 vol % or less to the light emission control layer 404. The light emission control layer 404 may contain other particles than non-fluorescent particles, such as fluorescent particles, and details thereof are described later.

More desirably, the non-fluorescent particles are dispersed at a proportion of 0.1 vol % or more and 5 vol % or less to the light emission control layer 404. Setting the volume concentration of the non-fluorescent particles to 5 vol % or less keeps the lowering of transmittance due to the dispersion of the non-fluorescent particles to a drop by approximately 10%. Setting the volume concentration of the non-fluorescent particles to 0.1% or more reduces the optical polarization degree effectively.

More desirably, the non-fluorescent particles are dispersed at a proportion of 0.1 vol % or more and 1 vol % or less to the light emission control layer 404. With the light emission control layer 404 containing non-fluorescent particles at a volume concentration within this range, the lowering of transmittance due to the dispersion of the non-fluorescent particles is lessened more satisfactorily and the optical polarization degree is reduced effectively.

When the light emission control layer 404 contains non-fluorescent particles at a volume concentration of 0.01 vol % or more and 10 vol % or less, the refractive index of the light emission control layer 404 hardly differs from that of the base material. The amount of light that enters the light emission control layer 404 from the nitride semiconductor light-emitting element 402 is therefore determined mostly by the refractive index of the light emission surface of the nitride semiconductor light-emitting element 402 and the refractive index of the base material of the light emission control layer 404. This means that it is not necessary to take into account the influence of the non-fluorescent particles on the refractive index of the light emission control layer 404, and facilitates designing.

The non-fluorescent particles desirably have a diameter (average value) of 30 nm or more and 150 nm or less. In this embodiment, the diameter of the non-fluorescent particles is measured by centrifugal sedimentation with the use of an ultra centrifugal sedimentation granularity distribution measuring apparatus manufactured by Beckman Coulter, Inc. The average diameter value is calculated by arithmetic averaging. If the non-fluorescent particles are smaller than 30 nm in diameter, the difference between the molecular size of the resin constituting the light emission control layer 404 and the size of the non-fluorescent particles is so large that the non-fluorescent particles may coagulate when mixed with the resin. Because the volume of a conglomerate is large, a conglomerate in the light emission control layer 404 causes Mie scattering, which prevents efficient reflection of light towards the sides and back. Setting the diameter of the non-fluorescent particles to 150 nm or less makes the size of the non-fluorescent particles sufficiently smaller than a value that is obtained by dividing the wavelength of light emitted from the nitride semiconductor light-emitting element 402 by the circle ratio pi. This is conducive to Rayleigh scattering and the optical polarization degree is thus reduced even more.

According to this embodiment, the optical polarization degree is reduced because optically polarized light that is emitted from the nitride semiconductor light-emitting element 402 is scattered by non-fluorescent particles within the light emission control layer 404. By containing non-fluorescent particles at the volume concentration given above, the light emission control layer 404 can effectively reduce the optical polarization degree while keeping the lowering of transmittance due to the dispersion of the non-fluorescent particles to a drop by approximately 20%. Moreover, Rayleigh scattering of the light can be induced by setting the diameter of the non-fluorescent particles to 30 nm or more and 150 nm or less.

It is preferred that the non-fluorescent particles have a refractive index of 1.4 or more and 2.9 or less. The refractive index of silicone resin or epoxy resin, for example, is approximately 1.4 to 1.6. Giving the non-fluorescent particles a large refractive index ensures that there is a refractive index difference between the non-fluorescent particles and the resin. The refractive index difference facilitates reflection at the boundary between the resin and the non-fluorescent particles, and the scattering coefficient of Rayleigh scattering is accordingly raised.

The material of the non-fluorescent particles can be $SiO_2$ (refractive index: 1.4), ZnO (refractive index: 2.0), $TiO_2$ (refractive index: 2.9), $Al_2O_3$ (refractive index: 1.7), or the like. For instance, the reflectance is $3.4 \times 10^4$ when $SiO_2$ having a refractive index of 1.4 is used as the non-fluorescent particles, whereas the reflectance is $2.5 \times 10^6$ when $TiO_2$ having a refractive index of 2.9 is used as the non-fluorescent particles. Thus, using non-fluorescent particles that have a high refractive index is effective for obtaining higher reflection.

If the refractive index is higher than 2.9, on the other hand, the refractive index difference between the light emission control layer 404 and the outside is large, which causes the lowering of external quantum efficiency and other problems.

The surfaces of the non-fluorescent particles may be treated with an organic in order to facilitate the dispersion of the non-fluorescent particles in the base material of the light emission control layer 404. In this case, wet agitating or the like is used to cover the surfaces of the non-fluorescent particles with an organic such as polyether modified silicone or polyglycerine modified silicone.

It is preferred that the non-fluorescent particles have a bandgap of 3.0 eV or more and 6.3 eV or less. When the bandgap of the non-fluorescent particles is 3.0 eV or more, light generated by the nitride semiconductor light-emitting element reacts with the non-fluorescent particles and is consequently absorbed little, which keeps the light emission efficiency from dropping. A bandgap larger than 6.3 eV causes problems such as too small a refractive index difference from the refractive index of the sealing resin. The bandgap of the non-fluorescent particles is more desirably 3.4 eV or larger.

The base material of the light emission control layer 404 can be, for example, silicone resin or epoxy resin.

Figure 6:
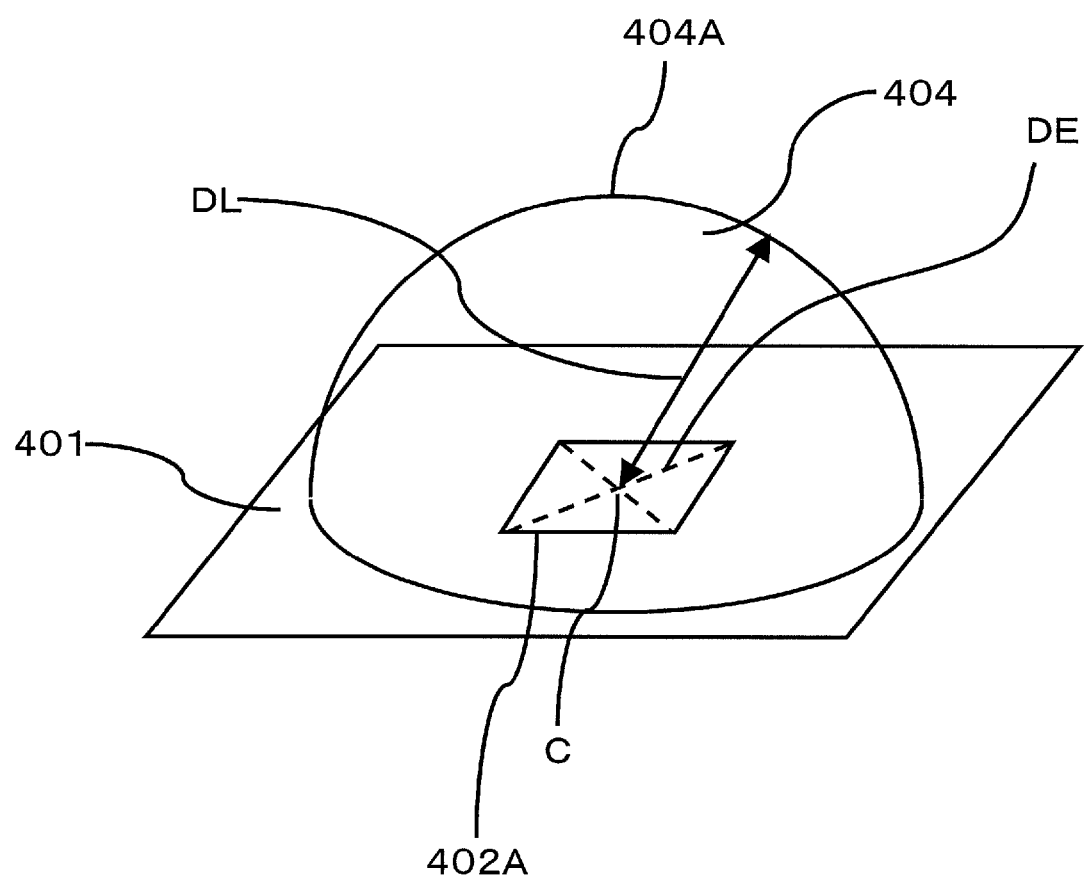
FIG. 6 is a perspective view illustrating a light-emitting device of FIG. 4A.

Next, referring to FIG. 6, an appropriate thickness of the light emission control layer 404 is described. FIG. 6 is a perspective view illustrating the light-emitting device of FIG. 4A. In FIG. 6, a graphic form 402A is an orthogonal projection image of the nitride semiconductor light-emitting element 402 projected onto the principal surface of the package substrate 401 (a surface of the package substrate 401 that supports the nitride semiconductor light-emitting element 402). A surface 404A is an interface of the light emission control layer 404 to the outside. The graphic form 402A is a square or a rectangle, and diagonal lines of the graphic form 402A intersect each other at an intersection point C. The distance from the intersection point C to an arbitrary point on the surface 404A is referred to as intra-layer distance DL. The length of a line segment connecting two points along the four sides of the graphic form 402A is referred to as intra-element distance DE. The two points, which are vertices of the graphic form 402A in FIG. 6, can be arbitrary points along the sides of the graphic form 402A.

It is preferred that the maximum value of the intra-layer distance DL be set to 1.5 times the maximum value of the intra-element distance DE or larger. More desirably, the minimum value of the intra-layer distance DL, too, is 1.5 times the maximum value of the intra-element distance DE or larger. Setting the size of the light-emitting device in this manner ensures that light exiting a sphere with a radius of DE is taken out to the atmosphere of the surroundings, instead of being totally reflected by the sphere with a radius of DE, when the ratio of the refractive index of the sealing resin to the atmosphere is 1.5 (Snell's law). The light emission efficiency is thus improved. From the viewpoint of device size reduction, it is preferred that the maximum value and minimum value of the intra-layer distance DL of the light emission control layer 404 be twice the maximum value of the intra-element distance DE of the nitride semiconductor light-emitting element 402 or less.

For example, when the interface of the light emission control layer 404 to the outside has a shape that is close to an arc in section, the chance of total reflection of light that enters the interface of the light emission control layer 404 to the outside is small.

The light emission control layer 404 may contain a fluorescent substance. The fluorescent substance is contained at a concentration of, for example, 0.01 vol % or more and 10 vol % or less. In the case where the nitride semiconductor light-emitting element 402 emits blue light, white light can be obtained by using the fluorescent substance to convert a part of the blue light into, for example, green light and red light, or yellow light. Without the light emission control layer 404 of this embodiment, the blue component of the white light undesirably maintains optical polarization characteristics. This embodiment, on the other hand, can reduce the optical polarization degree of each color component.

The material of the package substrate 401 can be alumina, AlN, a resin substrate, or the like. Si, Ge, and the like may also be used for the package substrate 401 and, in the case where one of these is employed, it is recommended to cover the substrate surface with an insulating film. The wiring is laid in a pattern suited to the electrode shape of the nitride semiconductor light-emitting element 402. The wiring can be made of Cu, Au, Ag, Al, or the like.

Japanese Patent Translation Publication No. Hei 11-500584 describes that the particles of the luminous substance pigments 307 are equal to or less than 20 µm in size, that the average particle diameter is 5 µm or less, and that a preferred average particle diameter is 1 to 2 µm. The publication also describes that the weight percent of the luminous substance pigments 307 in the casting material is 25 wt % or less or 15 wt % or less. Japanese Patent Translation Publication No. Hei 11-500584 does not mention lower limit values of the particle size and weight percent of the luminous substance pigments 307.

The average particle diameter of a fluorescent substance in general is approximately 1 µm or larger, at which fluorescent particles can be manufactured by a simple method. In this embodiment, non-fluorescent particles are used for the purpose of scattering light by Rayleigh scattering, and preferred to have a size on the order of nanometer. The luminous substance pigments 307 of Japanese Patent Translation Publication No. Hei 11-500584 are not used for the purpose of Rayleigh scattering and do not need to have a size on the order of nanometer.

Another difference is that, as it is generally true in similar cases, the weight percent of the luminous substance pigments 307 in the casting material would need to be approximately 10 wt % or more in order to convert the wavelength of light satisfactorily with the luminous substance pigments 307. In short, it is surmised that the luminous substance pigments 307 in Japanese Patent Translation Publication No. Hei 11-500584 are contained at a concentration significantly higher than the non-fluorescent particle concentration of this embodiment.

In Japanese Laid-Open Patent Publication No. 2005-197317, the medium is doped with the nanoparticles 312 in order to reduce the refractive index difference between the optical semiconductor element and the medium. The refractive index of the medium needs to be raised in order to make the refractive index of the medium close to that of the optical semiconductor element, and a material higher in refractive index than $TiO_2$ (refractive index: 2.85) is therefore used as the nanoparticles 312. The bandgap of $TiO_2$ is 3 eV and, because the refractive index is generally higher as the bandgap is smaller, Japanese Laid-Open Patent Publication No. 2005-197317 uses nanoparticles that have a bandgap of 3 eV or less. In this embodiment, on the other hand, it is preferred to use a material that has a bandgap of 3 eV or larger (more desirably, 3.4 eV or larger).

Japanese Laid-Open Patent Publication No. 2005-197317 also states that the medium needs to be doped with $TiO_2$ at a considerably high concentration in order to reduce the refractive index difference between the optical semiconductor element and the medium, and describes that the medium is doped with the nanoparticles 312 at a concentration of 67 vol % or less, for example. It is surmised that the nanoparticles 312 in Japanese Laid-Open Patent Publication No. 2005-197317 are contained at a concentration significantly higher than the non-fluorescent particle concentration of this embodiment.

Japanese Laid-Open Patent Publication No. 2005-197317 improves the efficiency at which light is extracted to the outside by providing first to third media, which are three different media covering the optical semiconductor element, such that the refractive index decreases in an outward direction from the semiconductor element.

Figure 14:
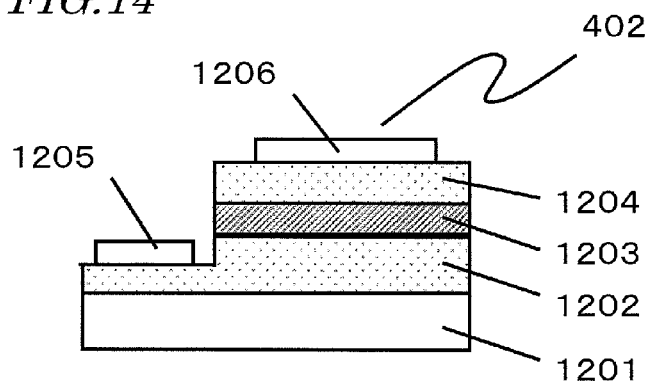
FIG. 14 is a diagram illustrating the structure of a nitride semiconductor light-emitting element.

Referring to FIG. 14, the nitride semiconductor light-emitting element 402 of this embodiment which has optical polarization characteristics is described next. The nitride semiconductor light-emitting element 402 of this embodiment includes, for example, a substrate 1201, which has an m-plane GaN layer on at least its front surface, an n-type nitride semiconductor layer 1202, which is formed on the m-plane GaN layer, a nitride semiconductor active layer 1203, a p-type nitride semiconductor layer 1204, a p-type electrode 1206, which is formed in contact with the p-type nitride semiconductor layer 1204, and an n-type electrode 1205, which is formed in contact with the n-type nitride semiconductor layer 1202. The term nitride semiconductor refers to a semiconductor made from a GaN-based material, more specifically, an $Al_xIn_yGa_zN$ ($x+y+z=1$, $x \geq 0$, $y \geq 0$, and $z \geq 0$) semiconductor. The term "m-plane" includes not only planes that are completely parallel to an m-plane but also planes that are at an angle of $\pm 5°$ or less to an m-plane. On a plane that is at a slight angle to an m-plane, the influence of spontaneous electrical polarization is very small. In crystal growth technology, the epitaxial growth of a semiconductor layer is in some cases easier on a substrate whose surface is slightly tilted from the crystal orientation than on a substrate whose surface coincides exactly with the crystal orientation. Tilting the crystal plane is therefore useful in some cases in order to improve the quality of a semiconductor layer to be grown by epitaxial growth or raise the crystal growth rate while sufficiently reducing the influence of spontaneous electrical polarization.

The substrate 1201 may be an m-plane GaN substrate, or may be an m-plane GaN layer on a substrate of a different type such as an m-plane GaN layer on an m-plane SiC substrate or an m-plane GaN layer on an r-plane sapphire substrate. The front surface of the substrate 1201 is not limited to an m-plane and only needs to have a plane orientation that gives optical polarization characteristics to light emitted from the nitride semiconductor active layer 1203. For instance, a substrate whose front surface is a non-polar plane such as an a-plane or a semi-polar plane such as an r-plane or a {11-22} plane may be used as the substrate 1201. Selecting the front surface of the substrate 1201 in this manner gives optical polarization characteristics to light radiated from the nitride semiconductor active layer 1203. A nitride semiconductor active layer formed on an m-plane, for example, mainly emits light whose electric field intensity is lopsidedly high in a direction parallel to an a-axis. A nitride semiconductor active layer formed on an a-plane mainly emits light whose electric field intensity is lopsidedly high in a direction parallel to an m-axis. A nitride semiconductor active layer formed on a {11-22} plane, which is a semi-polar plane, mainly emits light whose electric field intensity is lopsidedly high in a direction parallel to an m-axis when the In composition of the nitride semiconductor active layer is small, and mainly emits light whose electric field intensity is lopsidedly high in a direction parallel to a [-1-123] direction when the In composition of the nitride semiconductor active layer is large. The optical polarization characteristics of the nitride semiconductor active layer 1203 on a semi-polar plane as this are determined by the behavior of upper two bands of the valence (A band and B band). However, optical polarization characteristics are in some cases determined by the amount of strain applied to the nitride semiconductor active layer 1203 and the quantum confinement effect as well.

The n-type nitride semiconductor layer 1202 is made of, for example, n-type $Al_uGa_vIn_wN$ ($u+v+w=1$, $u \geq 0$, $v \geq 0$, and $w \geq 0$). Silicon (Si), for example, can be used as an n-type dopant.

The p-type nitride semiconductor layer 1204 is made of, for example, a p-type $Al_sGa_tN$ ($s+t=1$, $s \geq 0$, and $t \geq 0$) semiconductor. The p-type dopant of this layer is, for example, Mg. Examples of other dopants than Mg that can be used include Zn and Be. In the p-type nitride semiconductor layer 1204, the Al composition ratio s may be uniform in the thickness direction, or may change continuously or in stages in the thickness direction. To give a specific example, the p-type nitride semiconductor layer 1204 has a thickness of approximately 0.05 μm or more and 2 μm or less.

It is preferred that a region of the p-type nitride semiconductor layer 1204 that is close to the top face, in other words, a region close to the interface of the p-type nitride semiconductor layer 1204 to the p-type electrode 1206, be made of a semiconductor whose Al composition ratio s is zero, i.e., GaN. In this case, it is preferred that GaN contain p-type impurities at high concentration so that this region functions as a contact layer.

The nitride semiconductor active layer 1203 has, for example, a GaInN/GaInN multi-quantum well (MQW) structure in which $Ga_{1-x}In_xN$ well layers each having a thickness of approximately 3 nm or more and 20 nm or less and $Ga_{1-y}In_yN$ well layers ($0 \leq y < x < 1$) each having a thickness of approximately 5 nm or more and 30 nm or less and functioning as a barrier layer are stacked alternately.

The wavelength of light emitted from the nitride semiconductor light-emitting element 402 is determined by the In composition x in the $Ga_{1-x}In_xN$ semiconductor which is a semiconductor component of the well layers described above. A piezo-electric field is not generated in the nitride semiconductor active layer 1203 formed on an in-plane. The lowering of light emission efficiency can therefore be prevented even when the In composition is increased.

The n-type electrode 1205 is formed from, for example, a layered structure of a Ti layer and a Pt layer (Ti/Pt). It is preferred that the p-type electrode 1206 cover substantially the entire surface of the p-type nitride semiconductor layer 1204. The p-type electrode 1206 is formed from a layered structure of a Pd layer and a Pt layer (Pd/Pt), or the like.

Figure 15:
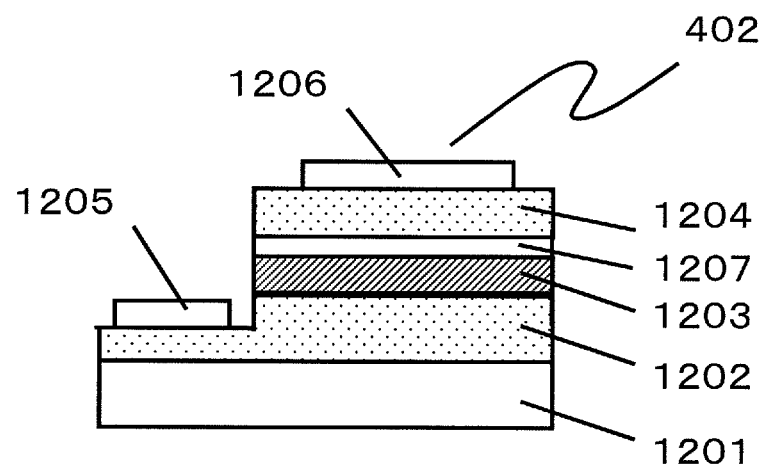
FIG. 15 is a diagram illustrating the structure of a modification example of the nitride semiconductor light-emitting element.

In this embodiment, an undoped GaN layer 1207 may be formed between the nitride semiconductor active layer 1203 and the p-type nitride semiconductor layer 1204 (see FIG. 15).

Figure 4B:
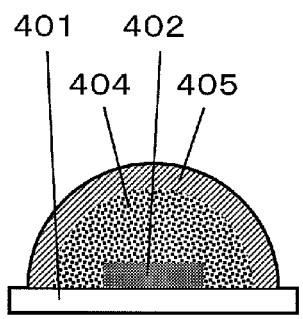
Figure 4C:
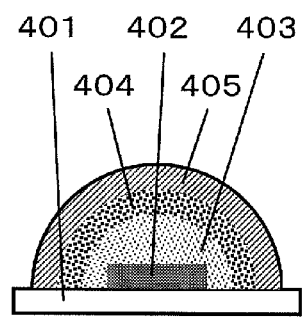
Figure 4D:
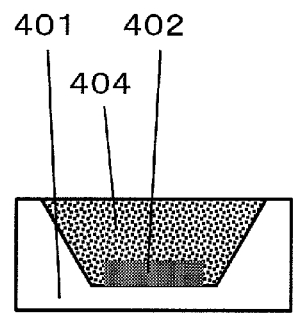

FIG. 4D is a sectional view illustrating a first modification example of the first embodiment. In this modification example, a concave portion is formed in the package substrate 401, and the nitride semiconductor light-emitting element 402 having optical polarization characteristics is packaged at the bottom of the concave portion. The nitride semiconductor light-emitting element 402 is connected by wiring to the package substrate 401. The light emission control layer 404 is disposed on the package substrate 401 so as to cover the nitride semiconductor light-emitting element 402 which has optical polarization characteristics. The top face of the light emission control layer 404 is a flat surface that stretches along the edges of the concave portion of the package substrate 401, and is shaped substantially like a straight line in section.

According to this modification example, the thickness of the light-emitting device can be reduced. In addition, because the light-emitting device can be formed just by pouring the material of the light emission control layer 404 in which non-fluorescent particles have been dispersed into the concave portion of the package substrate 401, the manufacturing method is simplified. It is also possible in this modification example to control radiant intensity distribution characteristics because of the concave portion formed in the package substrate 401.

Figure 4E:
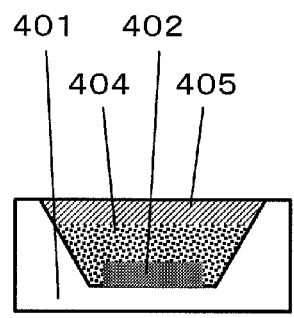
Figure 4F:
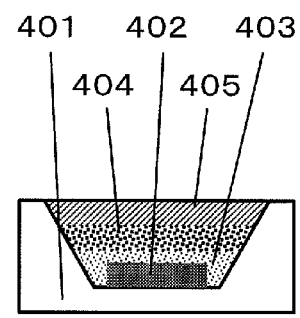
Figure 4G:
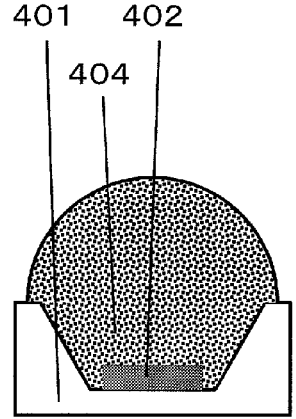

FIG. 4G is a sectional view illustrating a second modification example of the first embodiment. In this modification example, a concave portion is formed in the package substrate 401, and the nitride semiconductor light-emitting element 402 having optical polarization characteristics is packaged at the bottom of the concave portion. The nitride semiconductor light-emitting element 402 is connected by wiring to the package substrate 401.

The light emission control layer 404 is disposed on the package substrate 401 so as to cover the nitride semiconductor light-emitting element 402 which has optical polarization characteristics. The top face of the light emission control layer 404 is a flat surface that stretches along the edges of the concave portion of the package substrate 401, and is shaped substantially like a straight line in section.

It is also possible in this modification example to control radiant intensity distribution characteristics because of the concave portion formed in the package substrate 401.

Next, referring again to FIG. 14, a method of manufacturing the nitride semiconductor light-emitting element 402 according to this embodiment is described.

First, the n-type nitride semiconductor layer 1202 is grown by epitaxial growth by MOCVD or a similar method on the n-type GaN substrate 1201 which has an m-plane as the principal surface. For example, Si is used as n-type impurities, TMG($Ga(CH_3)_3$) and $NH_3$ are supplied as raw materials, and the n-type nitride semiconductor layer 1202 is made of GaN at a growth temperature of approximately 900° C. or more and 1,100° C. or less to a thickness of approximately 1 μm or more and 3 μm or less.

Next, the nitride semiconductor active layer 1203 is formed on the n-type nitride semiconductor layer 1202. The nitride semiconductor active layer 1203 has, for example, a GaInN/GaN multi-quantum well (MQW) structure in which $Ga_{1-x}In_xN$ well layers each having a thickness of 15 nm and GaN barrier layers each having a thickness of 30 nm are stacked alternately. When the $Ga_{1-x}In_xN$ well layers are formed, it is preferred that the growth temperature be lowered to 800° C. in order to introduce In. An emission wavelength appropriate for the use of the nitride semiconductor light-emitting element 402 is selected and the In composition x suited to the wavelength is determined. In the case where the emission wavelength is set to 450 nm (blue light), the determined In composition x is 0.18 or more and 0.2 or less. The In composition x is 0.29 or more and 0.31 or less in the case of 520 nm (green light), and 0.43 or more and 0.44 or less in the case of 630 nm (red light).

As described above, the undoped GaN layer 1207 (see FIG. 15) may be formed on the nitride semiconductor active layer 1203 by deposition to a thickness of, for example, 15 nm or more and 50 nm or less. In this case, the p-type nitride semiconductor layer 1204 is formed on the undoped GaN layer 1207. For example, $Cp_2Mg$ (cyclopentadienyl magnesium) is used as p-type impurities, TMG and $NH_3$ are supplied as raw materials, and the p-type nitride semiconductor layer 1204 is made of p-type GaN at a growth temperature of approximately 900° C. or more and 1,100° C. or less to a thickness of approximately 50 nm or more and 300 nm or less.

Figure 16:
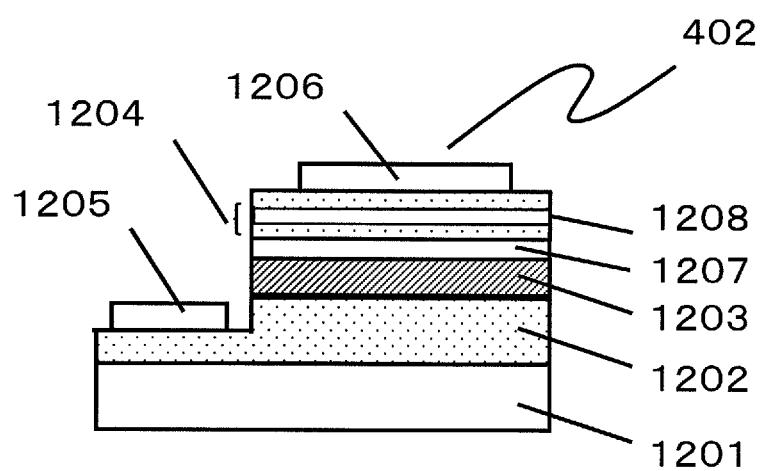
FIG. 16 is a diagram illustrating the structure of another modification example of the nitride semiconductor light-emitting element.

A p-AlGaN layer 1208 (see FIG. 16) with a thickness of approximately 15 nm or more and 30 nm or less may also be formed within the p-type nitride semiconductor layer 1204. Providing the p-AlGaN layer 1208 prevents an overflow of electrons while the light-emitting device is in operation.

A reference is made to FIG. 14 once more. After the p-type nitride semiconductor layer 1204 is formed, heat treatment is performed for about 20 minutes at a temperature of approximately 800° C. or more and 900° C. or less.

Next, the p-type nitride semiconductor layer 1204, the nitride semiconductor active layer 1203, and the n-type nitride semiconductor layer 1202 are partially removed by dry etching with the use of a chlorine-based gas, to thereby form a concave portion and expose a part of the n-type nitride semiconductor layer 1202.

Subsequently, the n-type electrode 1205 is formed in a manner that brings the n-type electrode 1205 into contact with the exposed part of the n-type nitride semiconductor layer 1202. A Ti/Pt layer, for example, is formed as the n-type electrode 1205. The p-type electrode 1206 is also formed in a manner that brings the p-type electrode 1206 into contact with the p-type nitride semiconductor layer 1204. A Pd/Pt layer, for example, is formed as the p-type electrode 1206. After that, heat treatment is performed to alloy the Ti/Pt layer of the n-type electrode 1205 with the n-type nitride semiconductor layer 1202, and to alloy the Pd/Pt layer of the p-type electrode 1206 with the p-type nitride semiconductor layer 1204.

The n-type GaN substrate 1201 is then thinned down to approximately 50 to 300 μm by polishing. Thinning the substrate facilitates dicing and, in addition, reduces the absorption of light in the nitride semiconductor light-emitting element 402.

The thus manufactured nitride semiconductor light-emitting element 402 is packaged on the package substrate 401 illustrated in FIG. 4A and other drawings. The material of the package substrate 401 can be alumina, AlN, a resin substrate, or the like. Si, Ge, and the like may also be used for the package substrate 401 and, in the case where one of those is employed, it is recommended to cover the substrate surface with an insulating film. The wiring is laid in a pattern suited to the electrode shape of the nitride semiconductor light-emitting element 402. The wiring can be made of Cu, Au, Ag, Al, or the like. The wiring is made of those materials on the package substrate 401 by sputtering or plating.

Next, the light emission control layer 404 of FIG. 4A is formed. In the case where titanium oxysulfate, for example, is used as the material of the non-fluorescent particles (TiO$_2$), hydrolysis is performed on the raw material to give the non-fluorescent particles a particle size of 30 nm or more and 150 nm or less. Next, in the case where two-part silicone resin, for example, is used as the material of the light emission control layer 404, a given amount of the silicone resin (two parts) and a given amount of the non-fluorescent particles are measured and put in a container to be agitated with a planetary agitator for about 15 minutes. The planetary agitator is capable of executing an agitation step, a kneading step, and a defoaming step simultaneously by controlling the orbital speed and autorotation speed of the container independently of each other and by perturbing the autorotation speed with time as a variable. The non-fluorescent particles can thus be dispersed relatively uniformly in the silicone resin. The planetary agitator is more desirably equipped with a vacuum defoaming mechanism, which makes it possible to remove air bubble components from the silicone resin in a short time. The thus obtained non-fluorescent particle-containing resin material is transferred to a dispenser syringe, and a necessary amount of the resin material is injected into a mold that has a concave shape. The package substrate 401 on which the nitride semiconductor light-emitting element 402 is packaged is set in the mold and the resin material is cured by thermal curing. The shape of the light emission control layer 404 is determined by the concave shape formed in the mold. In steps of manufacturing the light emission control layer 404 of FIG. 4D and the light emission control layer 404 of FIG. 4G, the non-fluorescent particle-containing resin material is injected into the concave portion in the package substrate 401 instead of the concave portion of the mold.

The gallium nitride-based semiconductor light-emitting device of the first embodiment is completed by the method described above.

The volume concentration of non-fluorescent particles in the light emission control layer can be measured by observing the layer's section with a transmission electron microscope (TEM) or a scanning electron microscope (SEM).

(Second Embodiment)

A second embodiment of the present invention is described with reference to FIG. 4B. In FIG. 4B, components that are the same as those in FIG. 4A are denoted by the same reference symbols and descriptions thereof are omitted. A description on a manufacturing method of the second embodiment is also omitted because the same manufacturing method as in the first embodiment can be used in the second embodiment.

FIG. 4B is a sectional view illustrating a gallium nitride-based semiconductor light-emitting device according to an embodiment of the present invention.

As illustrated in FIG. 4B, in the nitride semiconductor light-emitting device of this embodiment, the nitride semiconductor light-emitting element 402 which has optical polarization characteristics is packaged on the package substrate 401. The nitride semiconductor light-emitting element 402 is connected to the package substrate 401 by wiring.

The light emission control layer 404 is disposed on the package substrate 401 so as to cover the nitride semiconductor light-emitting element 402, which has optical polarization characteristics. A second sealing portion 405 is further provided on a surface (outer surface) of the light emission control layer 404.

The size of the second sealing portion 405 is described. As in the description given with reference to FIG. 6, diagonal lines of the graphic form 402A, which is an orthogonal projection image of the nitride semiconductor light-emitting element 402 projected onto the package substrate 401, intersect at the intersection point C, and the distance from the intersection point C to a surface of the second sealing portion 405 that is an interface to the outside is referred to as intra-layer distance D2 of the second sealing portion 405. It is preferred that the maximum value of the intra-layer distance D2 of the second sealing portion 405 be 1.5 times the intra-layer distance DL of the light emission control layer 404 or more. This has an advantage in that the light emission efficiency is improved. The intra-layer distance DL of the light emission control layer 404 is the distance from the intersection point C to an arbitrary point on a surface of the light emission control layer 404 that is an interface to the outside (here, the second sealing portion 405).

For example, when the interface of the second sealing portion 405 to the outside has a shape that is close to an arc in section, the chance of total reflection of light that enters the interface of the second sealing portion 405 to the outside is small.

It is more desired if the ratio of the maximum value of the intra-layer distance D2 of the second sealing portion 405 to the maximum value of the intra-layer distance DL of the light emission control layer 404 is set to a value larger than the refractive index of the light emission control layer 404 described above. This has an advantage in that the light emission efficiency is improved.

The material of the second sealing portion 405 can be, for example, silicone resin or epoxy resin. Alternatively, the second sealing portion 405 may be made of an inorganic material such as glass, diamond, sapphire, ZnO, or GaN. Using an inorganic material prevents the permeation of gas and moisture to the resin of the light emission control layer 404 and accordingly improves reliability.

The light emission control layer 404 may contain a fluorescent substance. In this case, the fluorescent substance is contained at a concentration of, for example, 0.01 vol % or more and 10 vol % or less.

The second embodiment, where the light emission control layer 404 can be designed thinner than in the first embodiment, has an advantage in that light radiated from the nitride semiconductor light-emitting element 402 is attenuated less by the light emission control layer 404.

FIG. 4E is a sectional view illustrating a first modification example of the second embodiment. In this modification example, a concave portion is formed in the package substrate 401, and the nitride semiconductor light-emitting element 402 which has optical polarization characteristics is packaged at the bottom of the concave portion. The nitride semiconductor light-emitting element 402 is connected to the package substrate 401 by wiring. The light emission control layer 404 is disposed on the package substrate 401 so as to cover the nitride semiconductor light-emitting element 402 which has optical polarization characteristics. The second sealing portion 405 is further provided on the outer surface of the light emission control layer 404. The top face of the second sealing portion 405 is a flat surface that stretches along the edges of the concave portion of the package substrate 401, and is shaped substantially like a straight line in section.

According to this modification example, the thickness of the light-emitting device can be reduced. In addition, because the light-emitting device can be formed just by pouring the material of the light emission control layer 404 in which non-fluorescent particles have been dispersed into the concave portion of the package substrate 401 and then pouring the material of the second sealing portion 405 into the concave portion, the manufacturing method is simplified. It is also possible in this modification example to control radiant intensity distribution characteristics because of the concave portion formed in the package substrate 401.

Figure 4H:
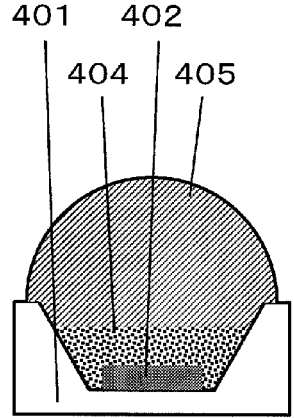

FIG. 4H is a sectional view illustrating a second modification example of the second embodiment. In this modification example, a concave portion is formed in the package substrate 401, and the nitride semiconductor light-emitting element 402 which has optical polarization characteristics is disposed at the bottom of the concave portion. The nitride semiconductor light-emitting element 402 is connected to the package substrate 401 by wiring. The light emission control layer 404 is disposed on the package substrate 401 so as to cover the nitride semiconductor light-emitting element 402 which has optical polarization characteristics. The second sealing portion 405 is provided outside the light emission control layer 404. The top face of the second sealing portion 405 is shaped substantially like an arc in section.

According to this modification example, radiant intensity distribution characteristics can be controlled because of the concave portion formed in the package substrate 401.

(Third Embodiment)

A third embodiment of the present invention is described with reference to FIG. 4C. In FIG. 4C, components that are the same as those in FIG. 4A or 4B are denoted by the same reference symbols and descriptions thereof are omitted. A description on a manufacturing method of the third embodiment is also omitted because the same manufacturing method as in the first embodiment can be used in the third embodiment.

FIG. 4C is a sectional view illustrating a nitride semiconductor light-emitting device according to an embodiment of the present invention.

As illustrated in FIG. 4C, in the nitride semiconductor light-emitting device of this embodiment, the nitride semiconductor light-emitting element 402 which has optical polarization characteristics is packaged on the package substrate 401. The nitride semiconductor light-emitting element 402 is connected to the package substrate 401 by wiring.

In this embodiment, a first sealing portion 403 is provided so as to cover the nitride semiconductor light-emitting element 402 which has optical polarization characteristics. The light emission control layer 404 is provided on the outer surface of the first sealing portion 403 so as to cover the first sealing portion 403. The second sealing portion 405 is further provided on the outer surface of the light emission control layer 404 so as to cover the light emission control layer 404.

The light emission control layer 404 in this embodiment contains non-fluorescent particles at a volume concentration of 0.01 vol % or more and 10 vol % or less as in the first embodiment. At a volume concentration within this range, the refractive index of the light emission control layer 404 hardly differs from that of the base material of the light emission control layer 404. The amount of light that enters the light emission control layer 404 from the nitride semiconductor light-emitting element 402 is therefore determined mostly by the refractive index of the light emission surface of the nitride semiconductor light-emitting element 402, the refractive index of the first sealing portion 403, and the refractive index of the base material of the light emission control layer 404. This means that it is not necessary in this embodiment to take into account the influence of the non-fluorescent particles on the refractive index of the light emission control layer 404, and facilitates designing. The base material of the light emission control layer 404 can be, for example, silicone resin or epoxy resin.

It is preferred that the maximum value of the intra-layer distance D2 of the second sealing portion 405 be 1.5 times the intra-layer distance DL of the light emission control layer 404 or more as in the second embodiment. This has an advantage in that the light emission efficiency is improved.

For example, when the interface of the second sealing portion 405 to the outside has a shape that is close to an arc in section, the chance of total reflection of light that enters the interface of the second sealing portion 405 to the outside is small.

It is more desired if the ratio of the maximum value of the intra-layer distance D2 of the second sealing portion 405 to the maximum value of the intra-layer distance DL of the light emission control layer 404 is set to a value larger than the refractive index of the light emission control layer 404 described above.

It is preferred that the hardness of the first sealing portion 403 be lower than that of the light emission control layer 404. Containing non-fluorescent particles, the light emission control layer 404 tends to be higher in viscosity than the base material. Accordingly, when there is a gap between the nitride semiconductor light-emitting element 402 and the package substrate 401, the light emission control layer 404 may fail to fill the gap completely. Setting the hardness of the first sealing portion 403 lower than that of the light emission control layer 404 helps the first sealing portion 403 to flow into surface irregularities in the wiring member, which is formed around the nitride semiconductor light-emitting element 402, and surface irregularities in the nitride semiconductor light-emitting element 402 without forming air bubbles. This embodiment thus has an advantage in that the yield in the resin sealing step is improved.

The first sealing portion 403 may contain a fluorescent substance. Containing a fluorescent substance in the first sealing portion 403 further improves radiant intensity distribution characteristics. In the case where the nitride semiconductor light-emitting element 402 emits blue light, white light can be obtained by using the fluorescent substance to convert a part of the blue light into, for example, green light and red light, or yellow light. Without the light emission control layer of this embodiment, the blue component of the white light undesirably maintains optical polarization characteristics. This embodiment, on the other hand, can reduce the optical polarization degree of each color component.

The material of the second sealing portion 405 can be, for example, silicone resin or epoxy resin. Alternatively, the second sealing portion 405 may be made of an inorganic material such as glass, diamond, sapphire, ZnO, or GaN. Using an inorganic material prevents the permeation of gas and moisture to the resin and accordingly improves reliability.

FIG. 4F is a sectional view illustrating a first modification example of the third embodiment. In this modification example, a concave portion is formed in the package substrate 401, and the nitride semiconductor light-emitting element 402 which has optical polarization characteristics is packaged at the bottom of the concave portion. The nitride semiconductor light-emitting element 402 is connected to the package substrate 401 by wiring. The first sealing portion 403 is formed so as to cover the nitride semiconductor light-emitting element 402. The light emission control layer 404 is further provided so as to cover the outer surface of the first sealing portion 403. The second sealing portion 405 is further provided so as to cover the outer surface of the light emission control layer 404. The top face of the second sealing portion 405 is a flat surface that stretches along the edges of the concave portion of the package substrate 401, and is shaped substantially like a straight line in section.

According to this modification example, the thickness of the light-emitting device can be reduced. In addition, because the light-emitting device can be formed just by pouring the material of the light emission control layer 404 in which non-fluorescent particles have been dispersed into the concave portion of the package substrate 401 and then pouring the materials of the second sealing portion 405 and the first sealing portion 403 into the concave portion, the manufacturing method is simplified. It is also possible in this modification example to control radiant intensity distribution characteristics because of the concave portion formed in the package substrate 401.

Figure 4I:
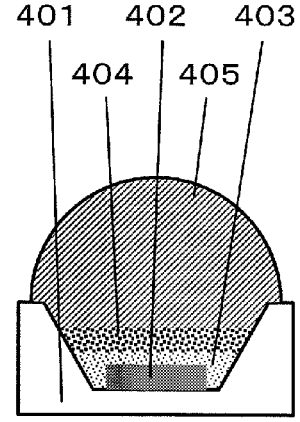

FIG. 4I is a sectional view illustrating a second modification example of the third embodiment. In this modification example, a concave portion is formed in the package substrate 401, and the nitride semiconductor light-emitting element 402 which has optical polarization characteristics is disposed at the bottom of the concave portion. The nitride semiconductor light-emitting element 402 is bonded to the package substrate 401 by wiring.

The first sealing portion 403 is formed so as to cover the nitride semiconductor light-emitting element 402 which has optical polarization characteristics. The light emission control layer 404 is further provided on the outer surface of the first sealing portion 403 so as to cover the first sealing portion 403. The second sealing portion 405 is further provided on the outer surface of the light emission control layer 404 so as to cover the light emission control layer 404. The top face of the second sealing portion 405 is shaped substantially like an arc in section.

According to this modification example, radiant intensity distribution characteristics can be controlled because of the concave portion formed in the package substrate 401.

(Fourth Embodiment)

Figure 5A:
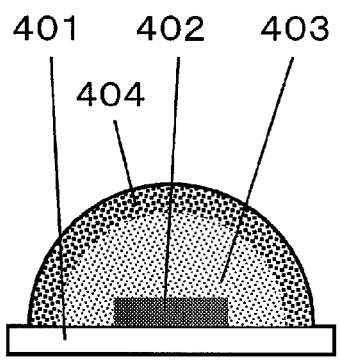
FIGS. 5A to 5C are diagrams schematically illustrating modes of sealing a light-emitting element according to the present invention.

A fourth embodiment of the present invention is described with reference to FIG. 5A. In FIG. 5A, components that are the same as those in FIG. 4A or 4C are denoted by the same reference symbols and descriptions thereof are omitted. A description on a manufacturing method of the fourth embodiment is also omitted because the same manufacturing method as in the first embodiment can be used in the fourth embodiment.

As illustrated in FIG. 5A, in the nitride semiconductor light-emitting device of this embodiment, the nitride semiconductor light-emitting element 402 which has optical polarization characteristics is packaged on the package substrate 401. The nitride semiconductor light-emitting element 402 is connected to the package substrate 401 by wiring.

In this embodiment, the first sealing portion 403 is provided so as to cover the nitride semiconductor light-emitting element 402 which has optical polarization characteristics. The light emission control layer 404 is provided on the outer surface of the first sealing portion 403 so as to cover the first sealing portion 403.

The light emission control layer 404 in this embodiment contains non-fluorescent particles at a volume concentration of 0.01 vol % or more and 10 vol % or less as in the first embodiment.

As in the first embodiment, it is preferred in this embodiment to set the maximum value of the intra-layer distance DL to 1.5 times the maximum value of the intra-element distance DE or more. This has an advantage in that the light emission efficiency is improved.

Figure 5B:
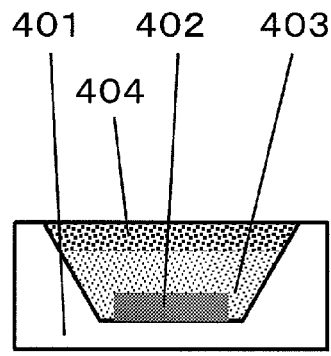

FIG. 5B is a sectional view illustrating a first modification example of the fourth embodiment. In this modification example, a concave portion is formed in the package substrate 401, and the nitride semiconductor light-emitting element 402 which has optical polarization characteristics is packaged at the bottom of the concave portion. The nitride semiconductor light-emitting element 402 is connected to the package substrate 401 by wiring. The first sealing portion 403 is formed so as to cover the nitride semiconductor light-emitting element 402. The light emission control layer 404 is further provided so as to cover the outer surface of the first sealing portion 403. The top face of the light emission control layer 404 is a flat surface that stretches along the edges of the concave portion of the package substrate 401, and is shaped substantially like a straight line in section.

According to this modification example, the thickness of the light-emitting device can be reduced. In addition, because the light-emitting device can be formed just by pouring the material of the light emission control layer 404 in which non-fluorescent particles have been dispersed into the concave portion of the package substrate 401 and then pouring the material of the first sealing portion 403 into the concave portion, the manufacturing method is simplified. It is also possible in this modification example to control radiant intensity distribution characteristics because of the concave portion formed in the package substrate 401.

Figure 5C:
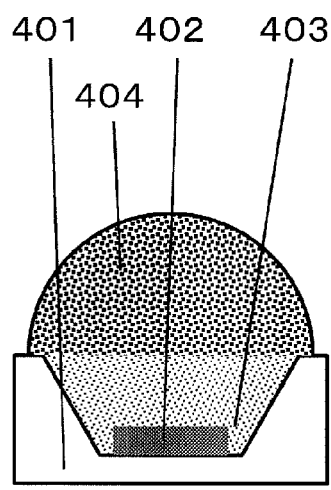

FIG. 5C is a sectional view illustrating a second modification example of the fourth embodiment. In this modification example, a concave portion is formed in the package substrate 401, and the nitride semiconductor light-emitting element 402 which has optical polarization characteristics is disposed at the bottom of the concave portion. The nitride semiconductor light-emitting element 402 is bonded to the package substrate by wiring.

The first sealing portion 403 is formed so as to cover the nitride semiconductor light-emitting element 402 which has optical polarization characteristics. The light emission control layer 404 is further provided on the outer surface of the first sealing portion 403 so as to cover the first sealing portion 403. The top face of the light emission control layer 404 is shaped substantially like an arc in section.

According to this modification example, radiant intensity distribution characteristics can be controlled because of the concave portion formed in the package substrate 401.

EXAMPLE 1

As Example 1, a light-emitting device having the structure of FIG. 4A was fabricated. The light emission control layer 404 in the light-emitting device of Example 1 contained $TiO_2$ nanoparticles. A light-emitting device having silicone resin that did not contain $TiO_2$ nanoparticles was fabricated as a comparative example, and a comparison was made between the characteristics of this light-emitting device and the characteristics of the light-emitting device of Example 1. Results thereof are described below.

First, a nitride semiconductor light-emitting element to be used in the light-emitting device of Example 1 was obtained by forming on an m-plane n-type GaN substrate an n-type nitride semiconductor layer, a nitride semiconductor active layer, and a p-type nitride semiconductor layer. The n-type nitride semiconductor layer was constituted of an n-type GaN layer with a thickness of 2 µm. The nitride semiconductor active layer had a three-period quantum well structure constituted of an InGaN quantum well layer with a thickness of 15 nm and a GaN barrier layer with a thickness of 30 nm. The p-type nitride semiconductor layer was constituted of a p-type GaN layer with a thickness of 0.5 µm. An n-type electrode and a p-type electrode were further made of a Ti/Pt layer on the n-type nitride semiconductor layer and from a Pd/Pt layer on the p-type nitride semiconductor layer, respectively, thereby obtaining a semiconductor array in which a plurality of nitride semiconductor light-emitting elements were arranged. The semiconductor array was divided by dicing along a c-axis direction [0001] and along an a-axis direction [11-20] into small pieces, specifically, 300-µm squares each bearing one nitride semiconductor light-emitting element. The nitride semiconductor light-emitting element piece was packaged by flip-chip packaging on an alumina package substrate with the use of Au bumps.

The base material used for resin sealing was two-part silicone resin having a refractive index of 1.5. The two parts of the silicone resin having a given ratio were measured for weight and transferred to a container for a planetary agitator. The volume of the silicone resin was calculated from the measured weight of the silicone resin and from the mass density per unit volume of the silicone resin. In order to set the volume concentration of $TiO_2$ nanoparticles with a diameter of 60 nm to 0.01 vol % or more and 10 vol % or less with respect to the combined volume of the calculated silicone resin volume and the volume of the $TiO_2$ nanoparticles, the weight of the $TiO_2$ nanoparticles that would give the $TiO_2$ nanoparticles a volume concentration within the above-mentioned range was calculated from the mass density per unit volume of the $TiO_2$ nanoparticles. With the calculated value as a reference, the $TiO_2$ nanoparticles were measured for weight and transferred to the container for the planetary agitator. When creating a resin that contains non-fluorescent particles, the volume concentration can be calculated from the mass densities per unit volume of the silicone resin and the non-fluorescent particles in this manner.

After that, an agitating rod was used to manually agitate for 10 minutes until the two parts of the silicone resin and the $TiO_2$ nanoparticles in the container were mixed uniformly.

The thus prepared silicone resin containing the $TiO_2$ nanoparticles was further agitated for 15 minutes with the planetary agitator until the materials in the silicone resin were mixed even more uniformly. In this agitation step using a planetary agitator, an agitation step, a kneading step, and a defoaming step were executed simultaneously by controlling the orbital speed and autorotation speed of the container independently of each other and by perturbing the autorotation speed with time as a variable. With this technology, the non-fluorescent particles were prevented from settling on the bottom of the container or along the wall of the container, the coagulation of non-fluorescent particles was also prevented, and silicone resin in which non-fluorescent particles were monodispersed ideally was obtained. In order to completely remove a small number of air bubbles from the silicone resin that had undergone the agitation process, the container without the lid was loaded into a vacuum chamber for a thorough defoaming step.

The thus obtained resin material capable of light emission control was transferred to a dispenser syringe to inject a necessary amount of the resin material into a mold having a hemispherical concave portion. The package substrate 401 on which the nitride semiconductor light-emitting element 402 had been packaged was set in the mold to fabricate by thermal curing a light-emitting device (the mode illustrated in FIG. 4A) in which the light emission control layer 404 was disposed on the package substrate 401 so as to cover the nitride semiconductor light-emitting element 402. For comparison, a light-emitting device having the light emission control layer 404 whose $TiO_2$ nanoparticle mixing ratio was 0 vol %, in other words, the light emission control layer 404 that did not contain non-fluorescent particles, was also fabricated (comparative example).

A phenomenon was observed in which the light emission efficiency was smaller when the maximum value of the intra-layer distance DL of the light emission control layer 404 was set to less than 1.5 times the maximum value of the intra-element distance DE of the nitride semiconductor light-emitting element 402, than when the maximum value of the distance DL was set equal to or larger than 1.5 times the maximum value of the distance DE. The intra-layer distance DL of the light emission control layer 404 was therefore designed to have a maximum value equal to or larger than 1.5 times the maximum value of the intra-element distance DE of the nitride semiconductor light-emitting element 402.

Specifically, the formed light emission control layer 404 had a hemispherical shape with a radius of 0.7 mm, and the maximum value of the intra-layer distance DL of the light emission control layer 404 was therefore 0.7 mm. The nitride semiconductor light-emitting element 402 was a 0.3-mm square, and the maximum value of the intra-element distance DE of the nitride semiconductor light-emitting element 402 was therefore approximately 0.42 mm. In this manner, the intra-layer distance DL of the light emission control layer 404 is designed to have a maximum value equal to or larger than 1.5 times the maximum value of the intra-element distance DE of the nitride semiconductor light-emitting element 402.

Figure 7:
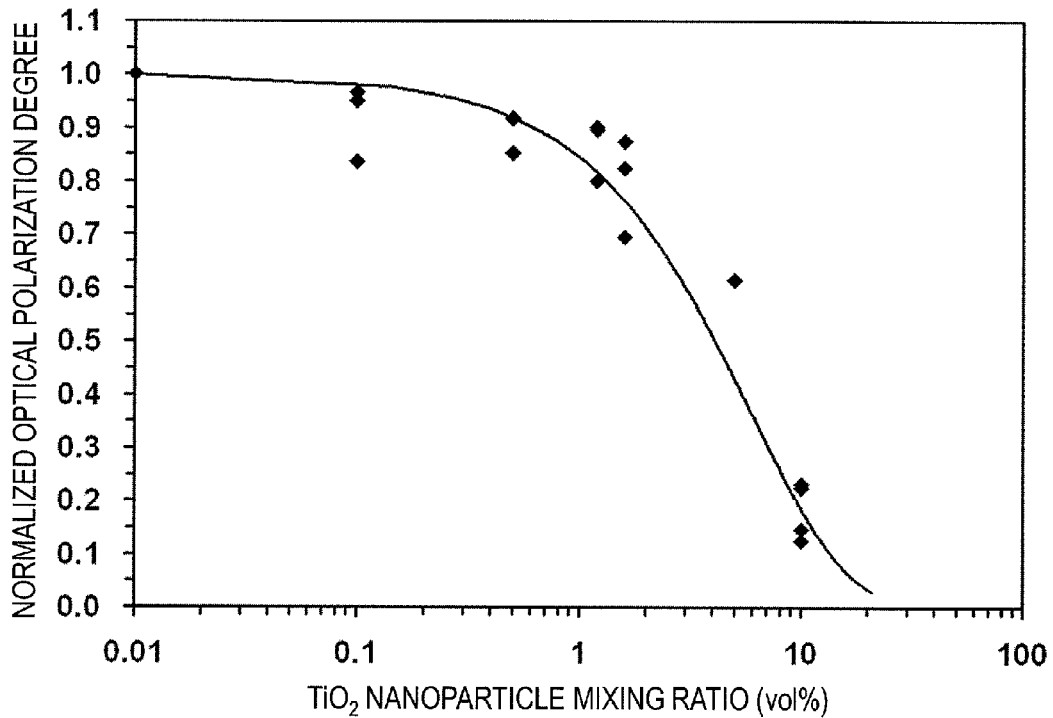
FIG. 7 is a graph showing a relation between the normalized optical polarization degree and the $TiO_2$ nanoparticle mixing ratio (vol %) of a light-emitting device according to Example 1.
Figure 8:
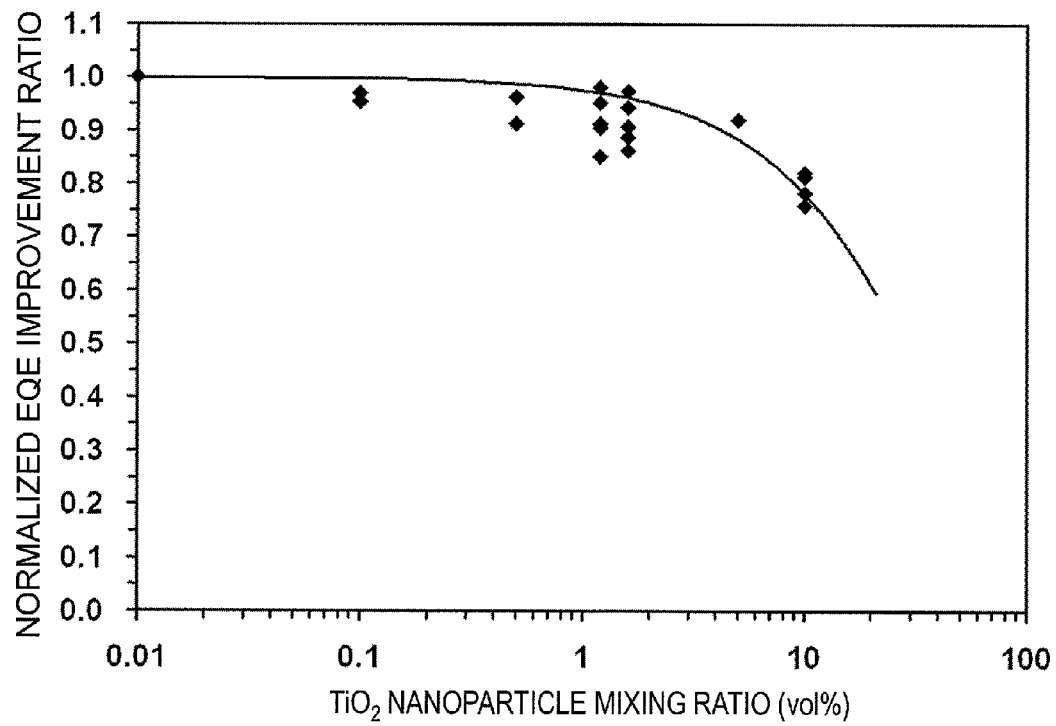
FIG. 8 is a graph showing a relation between the normalized external quantum efficiency (EQE) improvement ratio and the $TiO_2$ nanoparticle mixing ratio (vol %) of the light-emitting device according to Example 1 of the present invention which is sealed with a resin.

The light emission characteristics of the thus fabricated light-emitting element (light-emitting element having the light emission control layer 404 whose $TiO_2$ nanoparticle concentration was 0.01 vol % or more and 10 vol % or less) were evaluated and results are illustrated in FIGS. 7 and 8. FIG. 7 is a graph showing a relation between the normalized optical polarization degree of the light-emitting device of Example 1 and the $TiO_2$ nanoparticle mixing ratio (vol %) in the resin of the light-emitting device. FIG. 8 is a graph showing a relation between the normalized EQE (external quantum efficiency) improvement ratio and $TiO_2$ nanoparticle mixing ratio (vol %) of the light-emitting device according to Example 1 of the present invention which is sealed with a resin. The normalized optical polarization degree represented by the axis of ordinate of FIG. 7 is a value normalized in a manner that assigns 1 to the optical polarization degree observed when the $TiO_2$ nanoparticle mixing ratio is 0 vol %, in other words, when the light emission control layer 404 that does not contain nanoparticles is used. The normalized EQE represented by the axis of ordinate of FIG. 8 is a value normalized in a manner that assigns 1 to the EQE observed when the $TiO_2$ nanoparticle mixing ratio is 0 vol %, in other words, when the light emission control layer 404 that does not contain nanoparticles is used.

It can be seen in FIG. 7 that the effect of controlling optical polarization degree appears when the $TiO_2$ nanoparticle mixing ratio is 0.01 vol % or more. Specifically, the optical polarization degree drops to 99% when the $TiO_2$ nanoparticle mixing ratio is 0.01 vol %. The effect of reducing optical polarization degree peaks when the mixing ratio is 10 vol %. This effect is valid in a nitride semiconductor light-emitting element having a non-polar plane or a semi-polar plane as its principal surface which generates optically polarized light.

It can be seen in FIG. 8 that the normalized EQE value is kept at a value equal to or larger than 0.75 even when the $TiO_2$ nanoparticle mixing ratio reaches 10 vol %. This means that the lowering of EQE, namely, the lowering of the transmittance of the light emission control layer 404, is within an acceptable range if the $TiO_2$ nanoparticle mixing ratio is 10 vol % or less.

EXAMPLE 2

Results of reviewing the material of the non-fluorescent particles ($SiO_2$ nanoparticles, ZnO nanoparticles, and $TiO_2$ nanoparticles) which are to be contained in the light emission control layer 404 are described.

A nitride semiconductor light-emitting element to be used in the light-emitting device of Example 2 was obtained by forming on an m-plane n-type GaN substrate an n-type nitride semiconductor layer, a nitride semiconductor active layer, and a p-type nitride semiconductor layer. The n-type nitride semiconductor layer was constituted of an n-type GaN layer with a thickness of 2 µm. The nitride semiconductor active layer had a three-period quantum well structure constituted of an InGaN quantum well layer with a thickness of 15 nm and a GaN barrier layer with a thickness of 30 nm. The p-type nitride semiconductor layer was constituted of a p-type GaN layer with a thickness of 0.5 µm. An n-type electrode and a p-type electrode were further made of a Ti/Pt layer on the n-type nitride semiconductor layer and from a Pd/Pt layer on the p-type nitride semiconductor layer, respectively, thereby obtaining a semiconductor array in which a plurality of nitride semiconductor light-emitting elements were arranged. The semiconductor array was divided by dicing along a c-axis direction [0001] and along an a-axis direction [11-20] into small pieces, specifically, 300-µm squares each bearing one nitride semiconductor light-emitting element. The nitride semiconductor light-emitting element piece was packaged by flip-chip packaging on an alumina package substrate with the use of Au bumps.

The base material used for resin sealing was two-part silicone resin having a refractive index of 1.5. The two parts of the silicone resin having a given ratio were measured for weight and transferred to three containers for a planetary agitator. $SiO_2$ nanoparticles (refractive index: 1.4), ZnO nanoparticles (refractive index: 2.0), and $TiO_2$ nanoparticles (refractive index: 2.9) having a diameter of 150 nm were measured in amounts that would give the particles a volume concentration of 5% with respect to the volume of each of the three prepared silicone resin samples. The measured particles were respectively transferred to the three containers for the agitator. The volume concentration was calculated from the mass densities per unit volume of the silicone resin and the non-fluorescent particles.

After that, an agitating rod was used to manually agitate for 10 minutes until the two parts of the silicone resin and the non-fluorescent particles in the respective containers were mixed uniformly.

The thus prepared three different types of the silicone resin samples containing various types of nanoparticles were further agitated for 15 minutes, respectively, with the planetary agitator until the silicone resin samples were mixed even more uniformly as in Example 1. After that, in order to completely remove a small number of air bubbles from the silicone resin that had undergone the agitation process, each container without the lid was loaded into a vacuum chamber for a thorough defoaming step as in Example 1.

The thus obtained sealing resin capable of light emission control was transferred to a dispenser syringe to inject a necessary amount of the resin material into a mold having a hemispherical concave portion. The package substrate 401 on which the nitride semiconductor light-emitting element 402 had been packaged was set in the mold to fabricate by thermal curing a light-emitting device (the mode illustrated in FIG. 4A) in which the light emission control layer 404 was disposed on the package substrate 401 so as to cover the nitride semiconductor light-emitting element 402.

Figure 9:
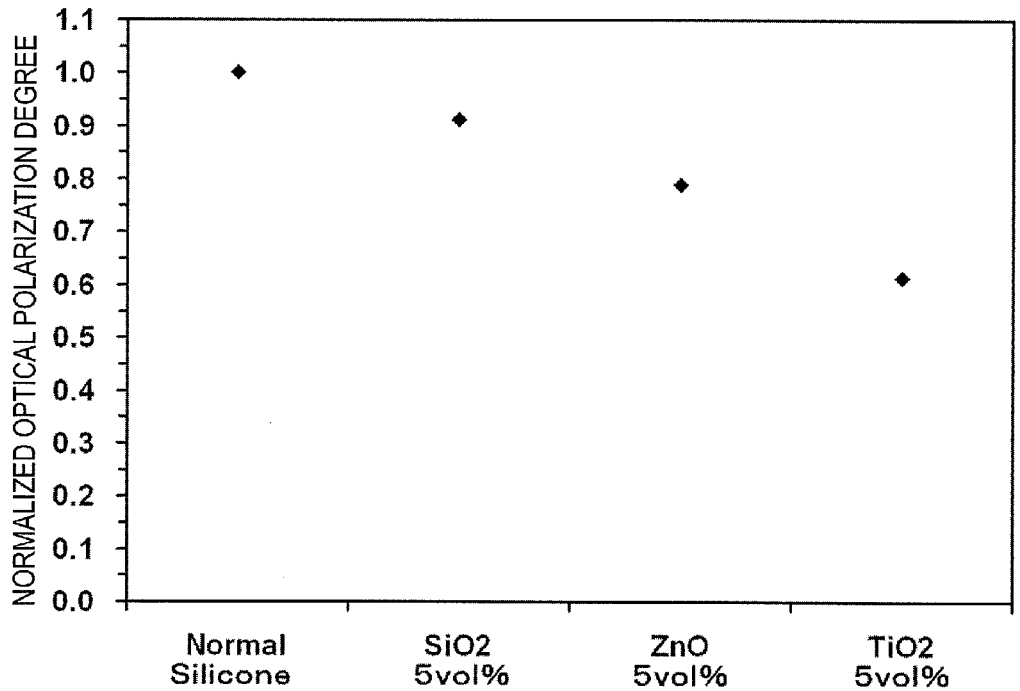
FIG. 9 is a graph showing a relation between the normalized optical polarization degree of a light-emitting device according to Example 2 of the present invention which is sealed with a resin and the type and concentration of nanoparticles contained in the resin.

The light emission characteristics of the thus fabricated light-emitting elements (light-emitting elements having the light emission control layers 404 whose $SiO_2$ nanoparticle concentration, ZnO nanoparticle concentration, and $TiO_2$ nanoparticle concentration were 5 vol %, respectively) were evaluated and results are illustrated in FIG. 9. FIG. 9 is a graph showing a relation between the normalized optical polarization degree of the light-emitting device of Example 2 and the types and concentrations of the non-fluorescent particles in the resin of the light-emitting device. The normalized optical polarization degree represented by the axis of ordinate of FIG. 9 is a value normalized in a manner that assigns 1 to the optical polarization degree observed when the non-fluorescent particle mixing ratio is 0 vol %, in other words, when the light emission control layer 404 that does not contain non-fluorescent particles is used.

It can be seen in FIG. 9 that the effect of improving the optical polarization degree appears even when $SiO_2$ nanoparticles whose refractive index (refractive index: 1.4) is lower than that of silicone (refractive index: 1.5) which is the base material are used. The effect increases as the difference from the refractive index of the base material grows, and peaks when $TiO_2$ nanoparticles (refractive index: 2.9) are used. In other words, it is understood also from the fact that the effect of the present invention is greater when the refractive index difference between the base material and non-fluorescent particles of the light emission control layer 404 is large and the reflectance of light that enters from the base material to the non-fluorescent particles is high, that the present invention is an application of a phenomenon in which light generated by the nitride semiconductor light-emitting element 402 is scattered by Rayleigh scattering due to the non-fluorescent particles contained in the light emission control layer 404. This effect is valid in a nitride semiconductor light-emitting element having a non-polar plane or a semi-polar plane as its principal surface which generates optically polarized light.

Note that, the effect of the present invention did not appear in an experiment where the same procedures were used to disperse non-fluorescent particles having a diameter of 150 nm or more in silicone resin or epoxy resin. This is probably because the effect of Mie scattering becomes dominant over the effect of Rayleigh scattering which is applied in the present invention when a value obtained by dividing the wavelength of light that the nitride semiconductor generates by the circle ratio pi is approximately equal to the diameter of the non-fluorescent particles.

The three different types of non-fluorescent particles used in the present invention all have a bandgap (forbidden band) of 3.0 eV or more. This is because non-fluorescent particles less than 3.0 eV in bandgap causes light generated by the nitride semiconductor light-emitting element 402 to be absorbed through reaction with the non-fluorescent particles, and consequently lowers the light emission efficiency.

EXAMPLE 3

Light-emitting devices having the structures of FIG. 4B and FIG. 4C were fabricated as Example 3. As a comparative example, a light-emitting device having silicone resin that did not contain $TiO_2$ nanoparticles was fabricated and the characteristics of this light-emitting device were compared against the characteristics of the light-emitting devices of Example 3. Results thereof are described below.

First, nitride semiconductor light-emitting elements used in the light-emitting devices of Example 3 were fabricated by the same method as in Example 1.

The base material used for resin sealing was two-part silicone resin having a refractive index of 1.5. The two parts of the silicone resin having a given ratio were measured for weight and transferred to two containers for a planetary agitator. $TiO_2$ nanoparticles having a diameter of 100 nm were measured in an amount that would give the $TiO_2$ nanoparticles a volume concentration of 10% with respect to the volume of one of the prepared silicone resin samples. The measured particles were transferred to one of the containers for the agitator. The volume concentration was calculated from the mass densities per unit volume of the silicone resin and the non-fluorescent particles. After that, the silicone resin that did not contain $TiO_2$ nanoparticles (comparative example) and the silicone resin that contained $TiO_2$ nanoparticles were both agitated manually with an agitating rod for 10 minutes until the materials in each container were mixed uniformly as in Example 1.

The thus prepared silicone resin that did not contain $TiO_2$ nanoparticles (comparative example) and the thus prepared silicone resin that contained $TiO_2$ nanoparticles were both further agitated for 15 minutes with the planetary agitator until the materials in each silicone resin were mixed even more uniformly as in Example 1. In order to completely remove a small number of air bubbles from the silicone resin that had undergone the agitation process, each container without the lid was loaded into a vacuum chamber for a thorough defoaming step as in Example 1.

The thus obtained two types of the sealing resin samples capable of light emission control were each transferred to a dispenser syringe.

Next, in order to fabricate the light-emitting device of the comparative example, a necessary amount of sealing resin that did not contain $TiO_2$ nanoparticles was injected into a mold having a hemispherical concave portion. The package substrate 401 on which the nitride semiconductor light-emitting element 402 having an m-plane as its principal surface had been packaged was set in the mold to fabricate by thermal curing a light-emitting device (the mode illustrated in FIG. 4A with the light emission control layer 404 not containing non-fluorescent particles) in which the first sealing portion 403 was disposed on the package substrate 401 so as to cover the nitride semiconductor light-emitting element 402 (comparative example).

Next, in order to fabricate the light-emitting device of FIG. 4B, a necessary amount of sealing resin that did not contain $TiO_2$ nanoparticles was injected into a mold having a hemispherical concave shape, and the second sealing portion 405 was formed first by thermal curing with the use of a mold having a hemispherical convex shape. A necessary amount of sealing resin that contained $TiO_2$ nanoparticles was injected thereon, the package substrate 401 on which the nitride semiconductor light-emitting element 402 had been packaged was set in the mold, and the resin was cured by thermal curing. The light-emitting device (the mode illustrated in FIG. 4B) in which the light emission control layer 404 was disposed on the package substrate 401 so as to cover the light emission control layer 404 was thus fabricated.

Finally, in order to fabricate the light-emitting device of FIG. 4C, a necessary amount of sealing resin that did not contain $TiO_2$ nanoparticles was injected into a mold having a hemispherical concave shape, and the second sealing portion 405 was formed first by thermal curing with the use of a mold having a hemispherical convex shape. A necessary amount of sealing resin that contained $TiO_2$ nanoparticles was further injected, the mold having the hemispherical convex shape was used again, and the resin was cured by thermal curing to form the light emission control layer 404. A necessary amount of sealing resin that did not contain $TiO_2$ nanoparticles was injected thereon, the package substrate 401 on which the nitride semiconductor light-emitting element 402 had been packaged was set in the mold, and the resin was cured by thermal curing. The light-emitting device (the mode illustrated in FIG. 4C) in which the first sealing portion 403 was disposed on the package substrate 401 so as to cover the nitride semiconductor light-emitting element 402 was thus fabricated.

Figure 10:
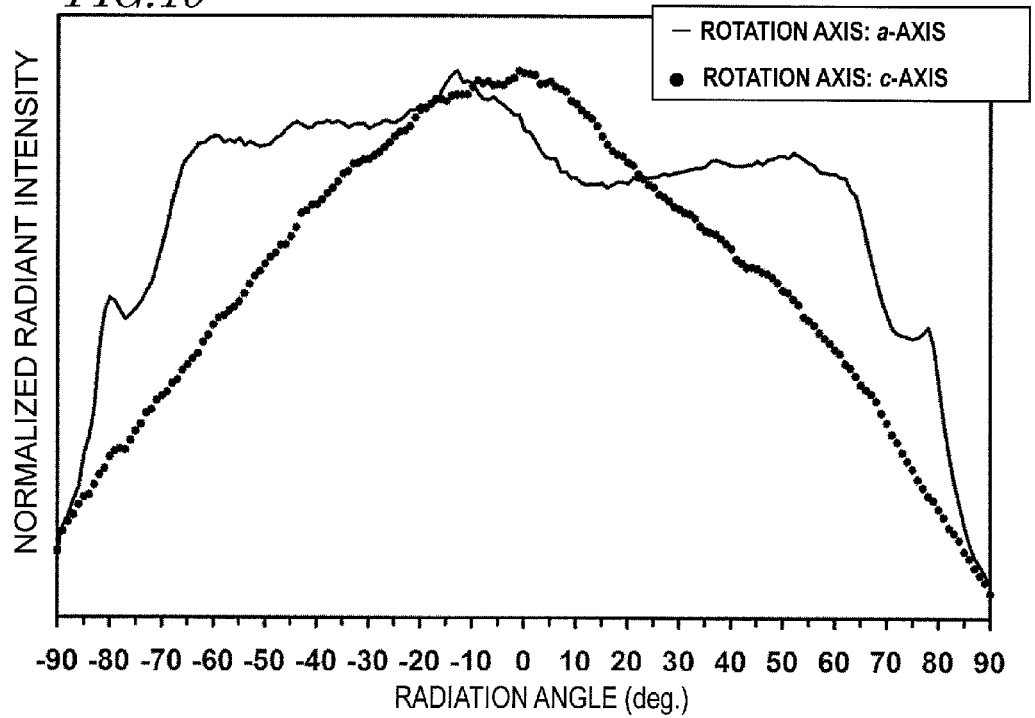
FIG. 10 is a graph showing a relation between the normalized radiant intensity and the radiation angle of a light-emitting device of FIG. 3A which has conventional optical polarization characteristics.
Figure 11:
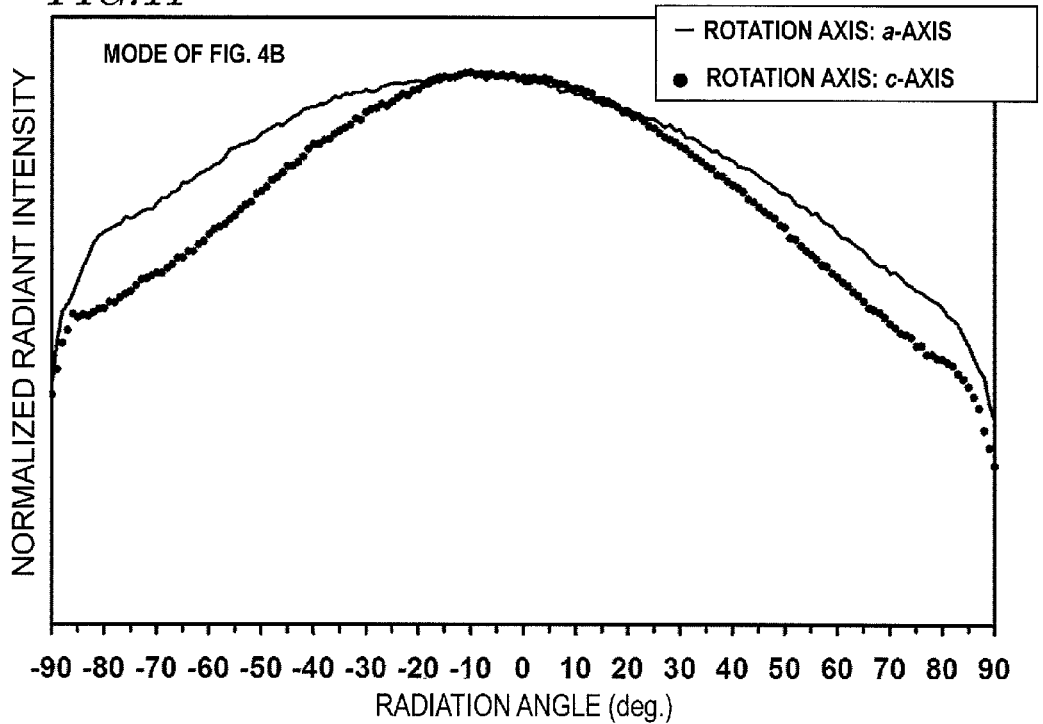
FIG. 11 is a graph showing a relation between the normalized radiant intensity and the radiation angle of a light-emitting device according to a second embodiment of the present invention that has the mode of FIG. 4B.
Figure 12:
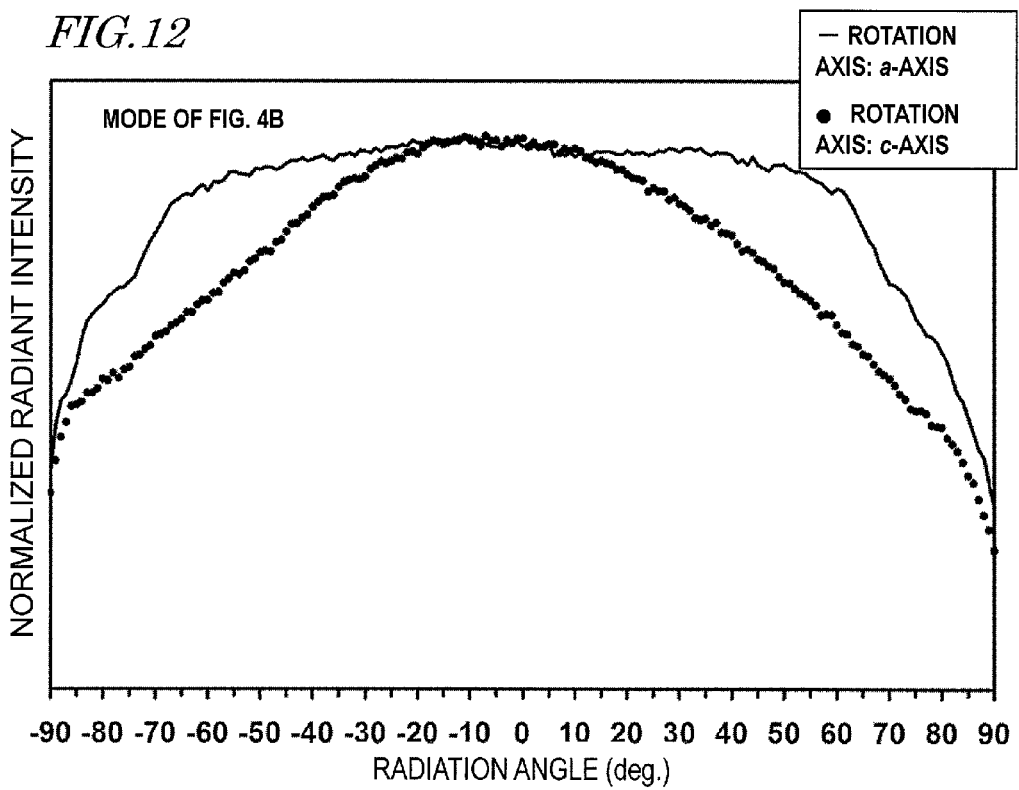
FIG. 12 is a graph showing a relation between the normalized radiant intensity and the radiation angle of a light-emitting device according to a third embodiment of the present invention that has the mode of FIG. 4C.

FIG. 10 is a graph showing radiant intensity distribution characteristics in the comparative example which does not contain $TiO_2$ nanoparticles. FIG. 11 is a graph showing radiant intensity distribution characteristics in the light-emitting device that has the structure of FIG. 4B. FIG. 12 is a graph showing radiant intensity distribution characteristics in the light-emitting device that has the structure of FIG. 4C.

Figure 13:
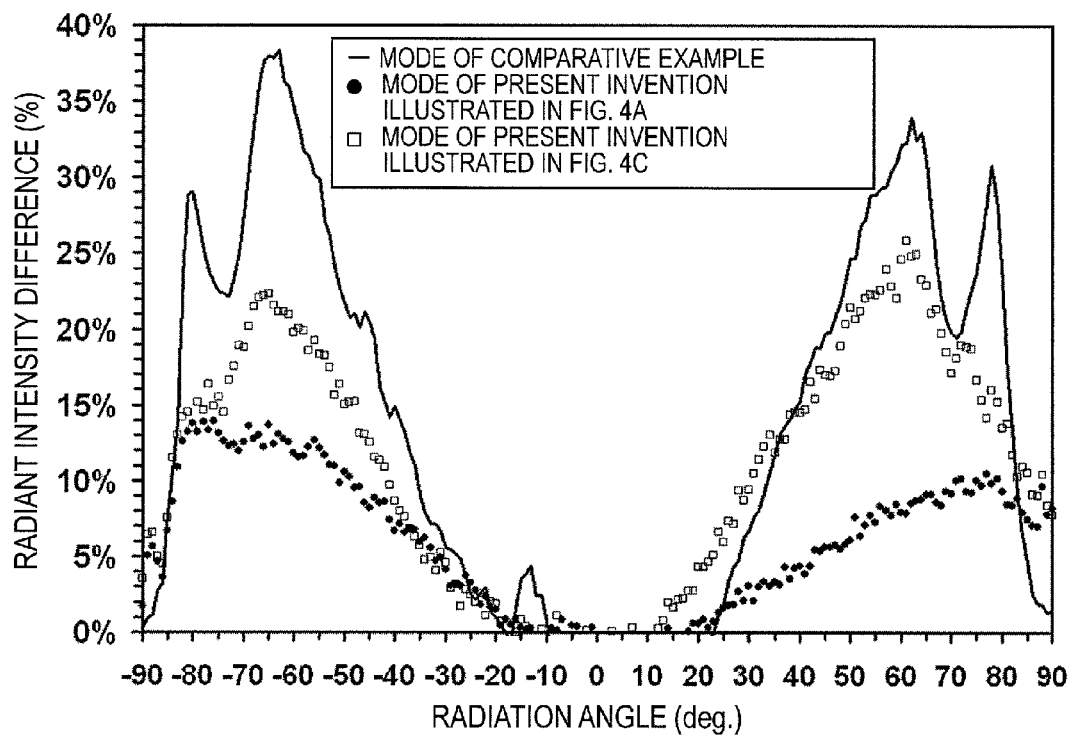
FIG. 13 is a graph showing a relation of the radiant intensity difference (%) between an a-axis and a c-axis to the radiation angle (deg.) in FIGS. 10, 11, and 12.

The radiant intensity distribution characteristics of FIGS. 10, 11, and 12 were obtained by measuring the radiant intensity under Condition A defined in CIE 127, which was issued by International Commission on Illumination, CIE. In each graph, the axis of abscissa represents the radiation angle, and indicates the normal line direction of an m-plane, namely, a tilt from an m-axis. In other words, the m-axis direction is 0°. Normalized radiant intensity represented by the axis of ordinate is a value normalized with the maximum value of radiant intensity. The solid line in each graph represents radiant intensity distribution characteristics observed when an a-axis is the rotation axis and an m-axis is tilted in a +c-axis direction and a −c-axis direction. The represented radiant intensity distribution characteristics are for radiation angles from −90° to 90°. The dotted line in each graph represents radiant intensity distribution characteristics observed when a c-axis is the rotation axis and an m-axis is tilted in an a-axis direction. The represented radiant intensity distribution characteristics are for radiation angles from −90° to 90°. FIG. 13 is a graph showing in percentage a difference in normalized radiant intensity between the case where the a-axis is the rotation axis and the case where the c-axis is the rotation axis at the same angle in FIGS. 10, 11, and 12.

The light-emitting elements used in Example 3 and having optical polarization characteristics have an m-plane as the principal surface, and light of the nitride semiconductor active layer is therefore optically polarized mainly in the a-axis direction. This means that the light-emitting elements radiate intense light in a direction perpendicular to the a-axis. The radiant intensity distribution characteristics observed when the a-axis is the rotation axis consequently have a distorted shape. The phenomenon that the radiant intensity distribution characteristics are distorted can be observed clearly in the graph of FIG. 10 which represents the comparative example. In the example of FIG. 11, the radiation angle of the a-axis direction is narrower and the radiation angle of the c-axis direction is wider than in the case where non-fluorescent particles are not contained. As is obvious from the graph of FIG. 13 showing a difference in normalized radiant intensity between the a-axis and the c-axis, the radiant intensity distribution characteristics in the comparative example are asymmetric by 38% at maximum.

The structure of FIG. 4B, on the other hand, is improved in asymmetry and is asymmetric by 14% points at maximum. In other words, if the radiant intensity in the m-axis direction is set as 100% and the angle in the m-axis direction is set as 0°, a difference in radiant intensity between radiant intensity distribution characteristics observed when the a-axis is the rotation axis and the angle range is from −90° to 90° and radiant intensity distribution characteristics observed when the c-axis is the rotation axis and the angle range is from −90° to 90° is 14% points or less at the same angle.

The structure of FIG. 4C of the present invention is improved in asymmetry and is asymmetric by 26% at maximum, 25% near the maximum. In other words, if the radiant intensity in the m-axis direction is set as 100% and the angle in the m-axis direction is set as 0°, a difference in radiant intensity between radiant intensity distribution characteristics observed when the a-axis is the rotation axis and the angle range is from −90° to 90° and radiant intensity distribution characteristics observed when the c-axis is the rotation axis and the angle range is from −90° to 90° is 26% points or less, or 25% or less, at the same angle. This means that radiant intensity distribution characteristics are improved as a result of the scattering of light by the $TiO_2$ nanoparticles. It is also understood from FIG. 12 that radiant intensity distribution characteristics can be improved if the light emission control layer 404 of the present invention is provided in some part of the sealing resin.

In the light-emitting device of FIG. 4C, the perimeter of the nitride semiconductor light-emitting element 402 is sealed with low-viscosity resin (first sealing portion 403) and then high-viscosity resin (light emission control layer 404) containing non-fluorescent particles is disposed on the resin surface. Because mixing non-fluorescent particles in the resin raises the viscosity of the resin, sealing the perimeter of the nitride semiconductor light-emitting element 402 with the light emission control layer 404 may create a gap. This possibility is avoided in the structure of FIG. 4C.

The refractive index of a resin used to seal a nitride semiconductor light-emitting element usually decreases in an outward direction from the nitride semiconductor light-emitting element 402. This structure is for improving the light emission efficiency. The structure of FIG. 4C takes an opposite approach in which high-refractive index resin (light emission control layer 404) covers the outside of low-refractive index resin (first sealing portion 403). The reflectance of light from the nitride semiconductor light-emitting element 402 is thus made higher at the boundary between the first sealing portion 403 and the light emission control layer 404. This increases the proportion of light components that are reflected within the light-emitting device before radiated to the outside, and therefore has an effect in that the optical polarization degree is reduced even more.

It is concluded from the above that the invention of this application is effective in a nitride semiconductor light-emitting element that has a non-polar plane or a semi-polar plane as the principal surface and that generates light whose radiant intensity distribution characteristics do not follow the Lambertian pattern.

EXAMPLE 4

As Example 4, light-emitting devices having the structures of FIGS. 4D to 4F were fabricated. Results thereof are described below.

First, nitride semiconductor light-emitting elements used in the light-emitting devices of Example 4 were fabricated by the same method as in Example 1.

Each resin sample prepared by the same procedures as in Example 1 was transferred to a dispenser syringe, a necessary amount of the resin was injected into the concave portion of the package substrate 401 on which the nitride semiconductor light-emitting element 402 had been packaged, and the resin was cured by thermal curing. A light-emitting device (the mode illustrated in FIG. 4D) in which the light emission control layer 404 was disposed on the package substrate 401 so as to cover the nitride semiconductor light-emitting element 402 was thus fabricated. A phenomenon was observed in which the light emission efficiency was smaller when the maximum value of the intra-layer distance DL of the light emission control layer 404 was set to less than 1.5 times the maximum value of the intra-element distance DE of the nitride semiconductor light-emitting element 402, than when the maximum value of the distance DL was set to equal to or larger than 1.5 times the maximum value of the distance DE. The intra-layer distance DL of the light emission control layer 404 was therefore designed to have a maximum value equal to or larger than 1.5 times the maximum value of the intra-element distance DE of the nitride semiconductor light-emitting element 402. In a more preferred mode, the minimum value of the intra-layer distance DL is also set to 1.5 times the maximum value of the intra-element distance DE of the nitride semiconductor light-emitting element 402 or more. It has been confirmed that the light emission efficiency is highest in this case. The modes illustrated in FIGS. 4E and 4F were obtained by adjusting the amount of sealing resin to be injected into the concave portion of the package substrate 401 and curing the sealing resin by thermal curing in stages. In the structures of FIGS. 4D to 4F, light radiated from the nitride semiconductor light-emitting element 402 in a lateral direction is reflected by the tilted portions of the package substrate 401. The resultant advantage is that radiant intensity distribution characteristics have a strong directivity.

EXAMPLE 5

As Example 5, light-emitting devices having the structures of FIGS. 4G to 4I were fabricated. Results thereof are described below.

First, nitride semiconductor light-emitting elements used in the light-emitting devices of Example 5 were fabricated by the same method as in Example 1.

Each resin sample prepared by the same procedures as in Example 1 was transferred to a dispenser syringe, a necessary amount of the resin was injected into the concave portion of the package substrate 401 on which the nitride semiconductor light-emitting element 402 had been packaged, and the resin was cured by thermal curing. A light-emitting device (the mode illustrated in FIG. 4D) in which the light emission control layer 404 was disposed on the package substrate 401 so as to cover the nitride semiconductor light-emitting element 402 was thus fabricated. After that, the sealing resin was injected into a mold having a hemispherical concave portion, the light-emitting element of FIG. 4D which had been sealed with resin was set in the mold, and the resin was cured by thermal curing. The mode illustrated in FIG. 4G was thus obtained. A phenomenon was observed in which the light emission efficiency was smaller when the maximum value of the intra-layer distance DL of the light emission control layer 404 was set to less than 1.5 times the maximum value of the intra-element distance DE of the nitride semiconductor light-emitting element 402, than when the maximum value of the distance DL was set to equal to or larger than 1.5 times the maximum value of the distance DE. The intra-layer distance DL of the light emission control layer 404 was therefore designed to have a maximum value equal to or larger than 1.5 times the maximum value of the intra-element distance DE of the nitride semiconductor light-emitting element 402. In a more preferred mode, the minimum value of the intra-layer distance DL is also set to 1.5 times the maximum value of the intra-element distance DE of the nitride semiconductor light-emitting element 402 or more. It has been confirmed that the light emission efficiency is highest in this case. The modes illustrated in FIGS. 4H and 4I were obtained by adjusting the amount of sealing resin to be injected into the concave portion of the package substrate 401 and curing the sealing resin by thermal curing in stages. In the structures of FIGS. 4G to 4I, light radiated from the nitride semiconductor light-emitting element 402 in a lateral direction is reflected by the tilted portions of the package substrate 401. This enhances the directivity of the light and, in addition, arranges the light radiation directions in an orderly manner at the outermost layer of the sealing resin. The resultant advantage is that radiant intensity distribution characteristics ideally close to the Lambertian pattern are obtained.

The light-emitting element according to the present invention is effective as a technology for improving the optical polarization characteristics and radiant intensity distribution characteristics of a light-emitting element that has a non-polar plane or a semi-polar plane as the principal surface to a practical level.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light-emitting device, comprising:
a nitride semiconductor light-emitting element which comprises a light emission surface and which radiates optically polarized light from the light emission surface; and
a light emission control layer which covers the light emission surface of the nitride semiconductor light-emitting element and which contains a resin and non-fluorescent particles dispersed in the resin,
wherein the light emission control layer contains the non-fluorescent particles at a proportion of 0.01 vol % or more and 10 vol % or less,
wherein the non-fluorescent particles have a diameter of 30 nm or more and 150 nm or less, and
wherein, when a radiant intensity in an m-axis direction is set as 100% and an angle in the m-axis direction is set as 0°, a difference in radiant intensity between radiant intensity distribution characteristics observed when an a-axis is a rotation axis and an angle range is from −90° to 90° and radiant intensity distribution characteristics observed when a c-axis is the rotation axis and the angle range is from −90° to 90° is 26% points or less at the same angle.

2. The light-emitting device according to claim 1, wherein, when the radiant intensity in the m-axis direction is set as 100% and the angle in the m-axis direction is set as 0°, a difference in radiant intensity between radiant intensity distribution characteristics observed when the a-axis is the rotation axis and the angle range is from −90° to 90° and radiant intensity distribution characteristics observed when the c-axis is the rotation axis and the angle range is from −90° to 90° is 25% points or less at the same angle.

3. The light-emitting device according to claim 1, wherein, when the radiant intensity in the m-axis direction is set as 100% and the angle in the m-axis direction is set as 0°, a difference in radiant intensity between radiant intensity distribution characteristics observed when the a-axis is the rotation axis and the angle range is from −90° to 90° and radiant intensity distribution characteristics observed when the c-axis is the rotation axis and the angle range is from −90° to 90° is 14% points or less at the same angle.

4. The light-emitting device according to claim 1, wherein the non-fluorescent particles have a refractive index of 1.4 or more and 2.9 or less.

5. The light-emitting device according to claim 1, wherein the non-fluorescent particles have a bandgap of 3.0 eV or more and 6.3 eV or less.

6. The light-emitting device according to claim 1, wherein the light emission control layer contains a fluorescent substance.

7. The light-emitting device according to claim 1, further comprising a second sealing portion which covers a surface of the light emission control layer.

8. The light-emitting device according to claim 1, further comprising a package substrate which supports the nitride semiconductor light-emitting element on a principal surface,
wherein a distance from a surface of the light emission control layer to an intersection point between diagonal lines of a graphic form which is an orthogonal projection image of the nitride semiconductor light-emitting element projected onto the principal surface of the package substrate is referred to as intra-layer distance, a length of a line segment that connects two points along sides of the graphic form is referred to as intra-element distance, and a maximum value of the intra-layer distance is 1.5 times a maximum value of the intra-element distance or more.

9. The light-emitting device according to claim 8, wherein a ratio of the maximum value of the intra-layer distance to the maximum value of the intra-element distance is larger than a refractive index of the light emission control layer.

10. The light-emitting device according to claim 7, further comprising a package substrate which supports the nitride semiconductor light-emitting element on a principal surface,
wherein a distance from a surface of the second sealing portion to an intersection point between diagonal lines of a graphic form which is an orthogonal projection image of the nitride semiconductor light-emitting element projected onto the principal surface of the package substrate is referred to as intra-layer distance of the second sealing portion, a distance from a surface of the light emission control layer to the intersection point between the diagonal lines of the graphic form is referred to as intra-layer distance of the light emission control layer, and a maximum value of the intra-layer distance of the second sealing portion is 1.5 times a maximum value of the intra-layer distance of the light emission control layer or more.

11. The light-emitting device according to claim 10, wherein a ratio of the maximum value of the intra-layer distance of the second sealing portion to the maximum value of the intra-layer distance of the light emission control layer is larger than a refractive index of the light emission control layer.

12. The light-emitting device according to claim 7, wherein the second sealing portion is made from an inorganic material.

13. The light-emitting device according to claim 1, further comprising a first sealing portion which covers the light emission surface of the nitride semiconductor light-emitting element,
wherein the light emission control layer covers the light emission surface of the nitride semiconductor light-emitting element from above the first sealing portion.

14. The light-emitting device according to claim 13, wherein the first sealing portion contains a fluorescent substance.

15. The light-emitting device according to claim 13, wherein the first sealing portion has a hardness lower than a hardness of the light emission control layer.

16. The light-emitting device according to claim 13, wherein the first sealing portion has a refractive index larger than a refractive index of the light emission control layer.

17. A light-emitting device, comprising:
a nitride semiconductor light-emitting element which comprises a light emission surface and which radiates optically polarized light from the light emission surface; and
a light emission control layer which covers the light emission surface of the nitride semiconductor light-emitting element and which contains a resin and non-fluorescent particles dispersed in the resin,
wherein the light emission control layer contains the non-fluorescent particles at a proportion of 0.01 vol % or more and 10 vol % or less,
wherein the light-emitting device has a narrower radiation angle in an a-axis direction and a wider radiation angle in a c-axis direction than when the light emission control layer does not contain the non-fluorescent particles,
wherein the light-emitting device further comprises a package substrate which supports the nitride semiconductor light-emitting element on a principal surface, and
wherein a distance from a surface of the light emission control layer to an intersection point between diagonal lines of a graphic form which is an orthogonal projection image of the nitride semiconductor light-emitting element projected onto the principal surface of the package substrate is referred to as intra-layer distance, a length of a line segment that connects two points along sides of the graphic form is referred to as intra-element distance, and a maximum value of the intra-layer distance is 1.5 times a maximum value of the intra-element distance or more.

18. The light-emitting device according to claim 17, wherein a ratio of the maximum value of the intra-layer distance to the maximum value of the intra-element distance is larger than a refractive index of the light emission control layer.

19. A light-emitting device, comprising:
a nitride semiconductor light-emitting element which comprises a light emission surface and which radiates optically polarized light from the light emission surface; and
a light emission control layer which covers the light emission surface of the nitride semiconductor light-emitting element and which contains a resin and non-fluorescent particles dispersed in the resin,
wherein the light emission control layer contains the non-fluorescent particles at a proportion of 0.01 vol % or more and 10 vol % or less,
wherein the light-emitting device has a narrower radiation angle in an a-axis direction and a wider radiation angle in a c-axis direction than when the light emission control layer does not contain the non-fluorescent particles,
wherein the light-emitting device further comprises a second sealing portion which covers a surface of the light emission control layer,
wherein the light-emitting device further comprises a package substrate which supports the nitride semiconductor light-emitting element on a principal surface, and
wherein a distance from a surface of the second sealing portion to an intersection point between diagonal lines of a graphic form which is an orthogonal projection image of the nitride semiconductor light-emitting element projected onto the principal surface of the package substrate to a surface of the light emission control layer is referred to as intra-layer distance of the second sealing portion, a distance from a surface of the light emission control layer to the intersection point between the diagonal lines of the graphic form is referred to as intra-layer distance of the light emission control layer, and a maximum value of the intra-layer distance of the second sealing portion is 1.5 times a maximum value of the intra-layer distance of the light emission control layer or more.

20. The light-emitting device according to claim 19, wherein a ratio of the maximum value of the intra-layer distance of the second sealing portion to the maximum value of the intra-layer distance of the light emission control layer is larger than a refractive index of the light emission control layer.

21. A light-emitting device, comprising:
a nitride semiconductor light-emitting element which comprises a light emission surface and which radiates optically polarized light from the light emission surface; and a light emission control layer which covers the light emission surface of the nitride semiconductor light-emitting element and which contains a resin and non-fluorescent particles dispersed in the resin, wherein the light emission control layer contains the non-fluorescent particles at a proportion of 0.01 vol % or more and 10 vol % or less, wherein the light-emitting device has a narrower radiation angle in an a-axis direction and a wider radiation angle in a c-axis direction than when the light emission control layer does not contain the non-fluorescent particles, wherein the light-emitting device further comprises a first sealing portion which covers the light emission surface of the nitride semiconductor light-emitting element, and wherein the light emission control layer covers the light emission surface of the nitride semiconductor light-emitting element from above the first sealing portion.

22. The light-emitting device according to claim 21, wherein the first sealing portion contains a fluorescent substance.

23. The light-emitting device according to claim 21, wherein the first sealing portion has a hardness lower than a hardness of the light emission control layer.

24. The light-emitting device according to claim 21, wherein the first sealing portion has a refractive index larger than a refractive index of the light emission control layer.

25. A light-emitting device, comprising:

a nitride semiconductor light-emitting element which comprises a light emission surface and which radiates optically polarized light from the light emission surface; and a light emission control layer which covers the light emission surface of the nitride semiconductor light-emitting element and which contains a resin and non-fluorescent particles dispersed in the resin, wherein the light emission control layer contains the non-fluorescent particles at a proportion of 0.01 vol % or more and 10 vol % or less, and wherein the non-fluorescent particles have a diameter of 30 nm or more and 150 nm or less.

\* \* \* \* \*